United States Patent
Ledentsov et al.

(10) Patent No.: US 10,283,937 B2
(45) Date of Patent: May 7, 2019

(54) OPTOELECTRONIC DEVICE WITH ENHANCED LATERAL LEAKAGE OF HIGH ORDER TRANSVERSE OPTICAL MODES INTO ALLOY-INTERMIXED REGIONS AND METHOD OF MAKING SAME

(71) Applicant: VI Systems GmbH, Berlin (DE)

(72) Inventors: Nikolay Ledentsov, Berlin (DE); Nikolay Ledentsov, Jr., Berlin (DE); Vitaly Shchukin, Berlin (DE)

(73) Assignee: VI Systems GmbH, Berlin (DE)

( * ) Notice: Subject to any disclaimer, the term of this patent is extended or adjusted under 35 U.S.C. 154(b) by 0 days.

(21) Appl. No.: 15/040,965

(22) Filed: Feb. 10, 2016

(65) Prior Publication Data

US 2017/0317472 A1  Nov. 2, 2017

(51) Int. Cl.
*H01S 5/183* (2006.01)
*H01S 5/187* (2006.01)
*H01S 5/30* (2006.01)
*H01S 5/32* (2006.01)
*H01S 5/02* (2006.01)
*H01S 5/18* (2006.01)
*H01S 5/20* (2006.01)
*H01S 5/42* (2006.01)

(52) U.S. Cl.
CPC ............ *H01S 5/183* (2013.01); *H01S 5/0206* (2013.01); *H01S 5/18* (2013.01); *H01S 5/187* (2013.01); *H01S 5/18327* (2013.01); *H01S 5/2072* (2013.01); *H01S 5/3054* (2013.01); *H01S 5/32* (2013.01); *H01S 5/1833* (2013.01); *H01S 5/18313* (2013.01); *H01S 5/423* (2013.01); *H01S 2301/166* (2013.01)

(58) Field of Classification Search
CPC .......... H01S 5/183; H01S 5/18; H01S 5/0206; H01S 5/3054; H01S 5/187; H01S 5/32
See application file for complete search history.

(56) References Cited

U.S. PATENT DOCUMENTS

| 4,871,690 A * | 10/1989 | Holonyak, Jr. ........ B82Y 20/00 148/DIG. 160 |
| 2007/0290191 A1* | 12/2007 | Shuchukin ............ H01L 33/105 257/14 |
| 2013/0034117 A1* | 2/2013 | Hibbs-Brenner ..... H01S 5/1833 372/45.01 |

* cited by examiner

*Primary Examiner* — Xinning (Tom) Niu
(74) *Attorney, Agent, or Firm* — Gordon Rees Scully Mansukhani, LLP

(57) ABSTRACT

Optoelectronic device undergoes selective chemical transformation like alloy compositional intermixing forming a non-transformed core region and an adjacent to it periphery where transformation has occurred. Activated by selective implantation or diffusion of impurities like Zinc or Silicon, implantation or diffusion of point defects, or laser annealing, transformation results in a change of the refractive index such that the vertical profile of the refractive index at the periphery is distinct from that in the core. Therefore the optical modes of the core are no longer orthogonal to the modes of the periphery, are optically coupled to them and exhibit lateral leakage losses to the periphery. High order transverse optical modes associated to the same vertical optical mode have higher lateral leakage losses to the periphery than the fundamental transverse optical mode, thus supporting single transverse mode operation of the device. This approach applies to single transverse mode vertical cavity surface emitting lasers, edge-emitting lasers and coherently coupled arrays of such devices.

30 Claims, 25 Drawing Sheets

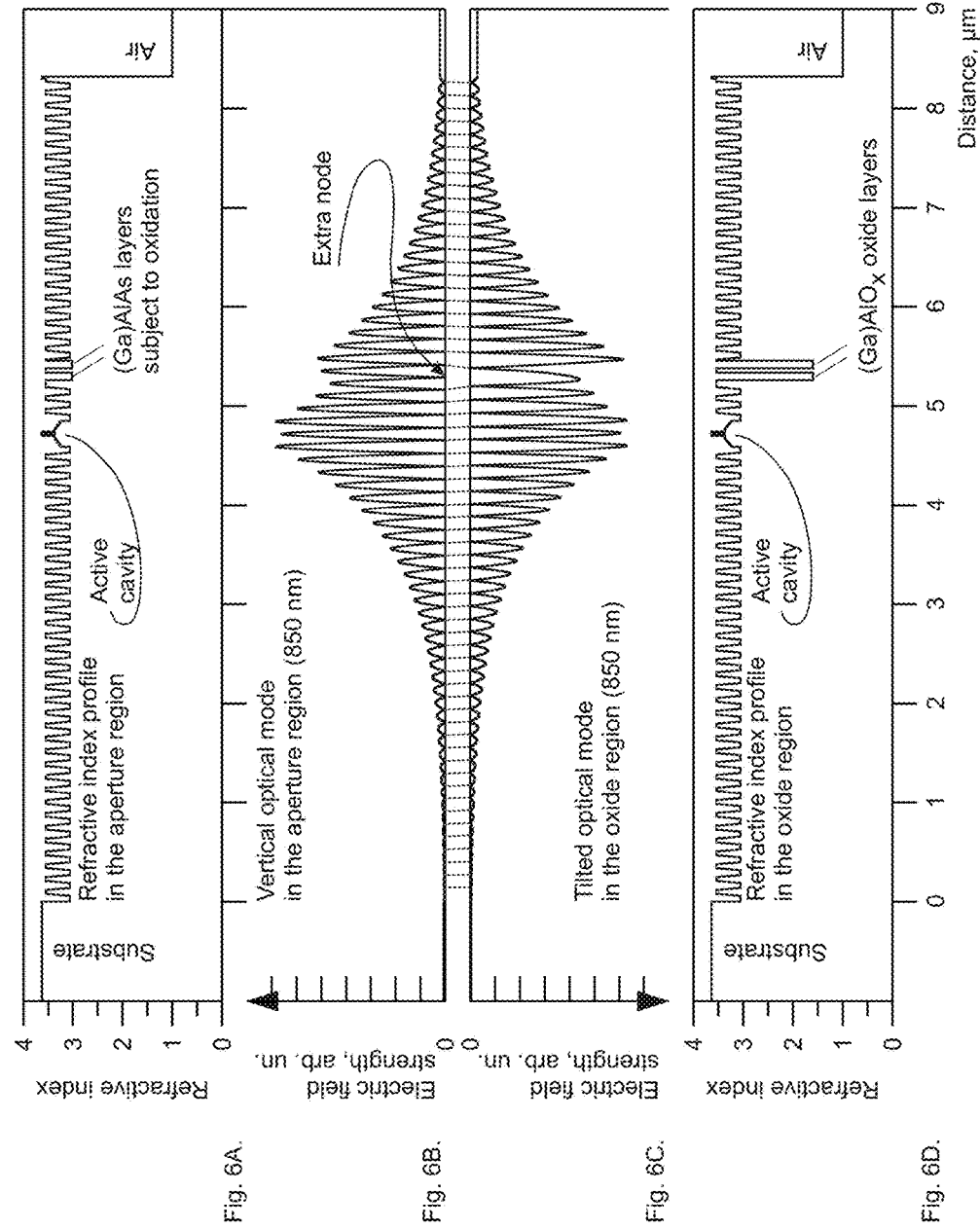

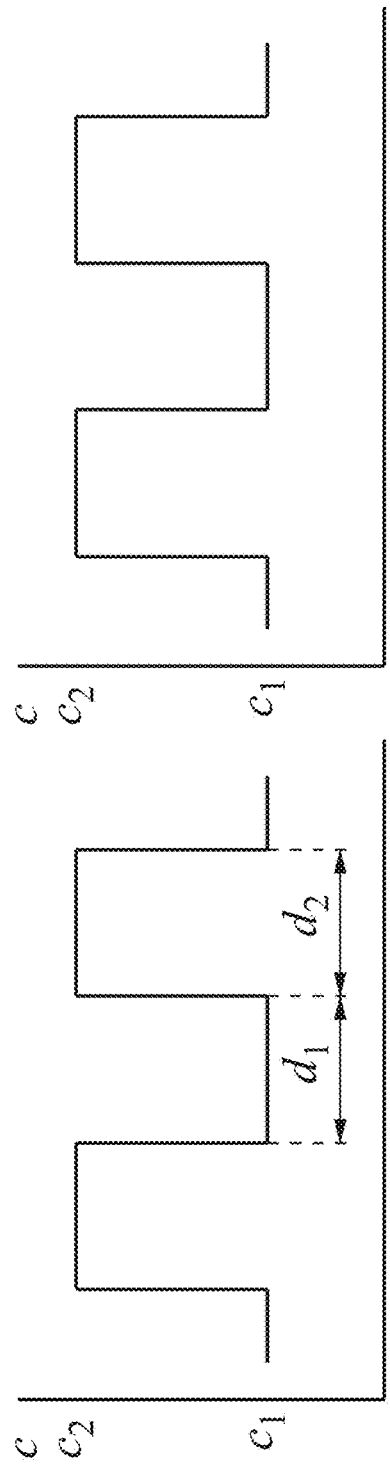
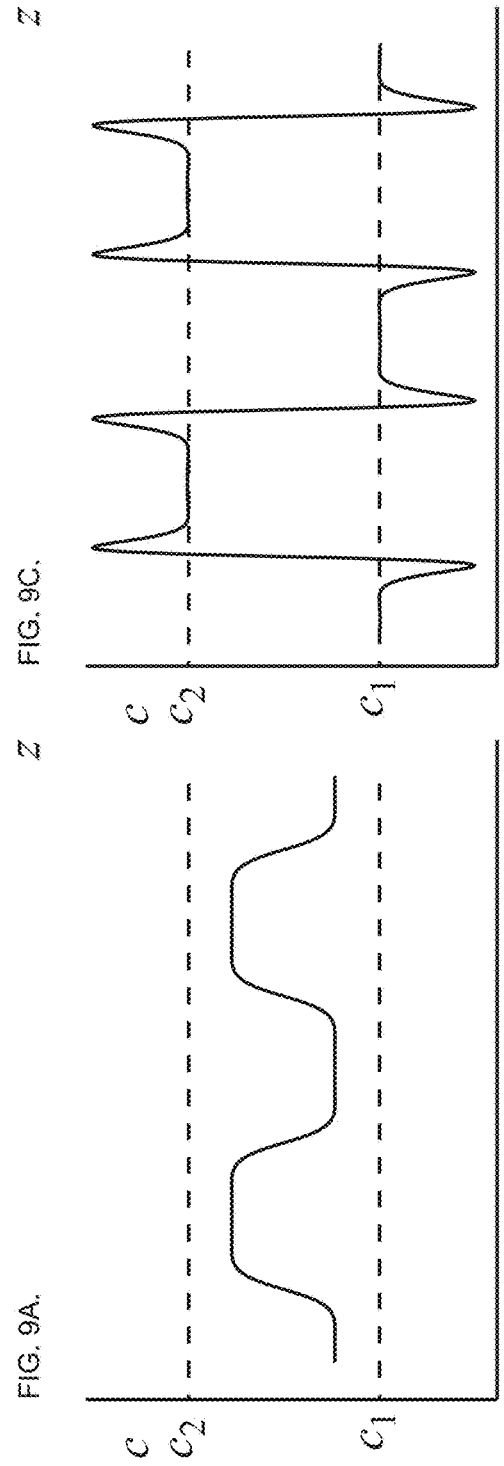
FIG. 9A.
FIG. 9B.
FIG. 9C.
FIG. 9D.

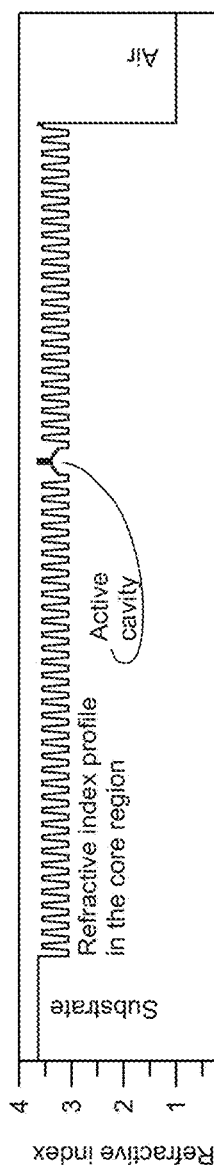
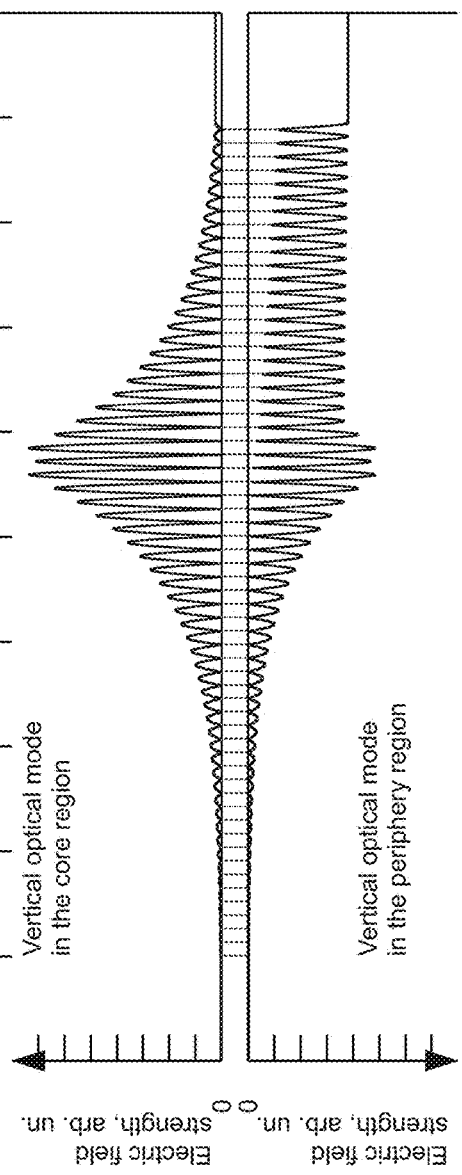
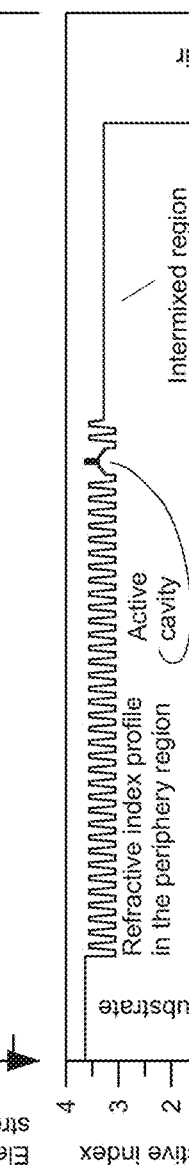
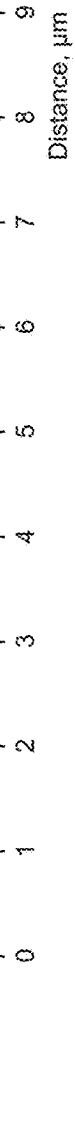
Fig. 11A.
Fig. 11B.
Fig. 11C.
Fig. 11D.

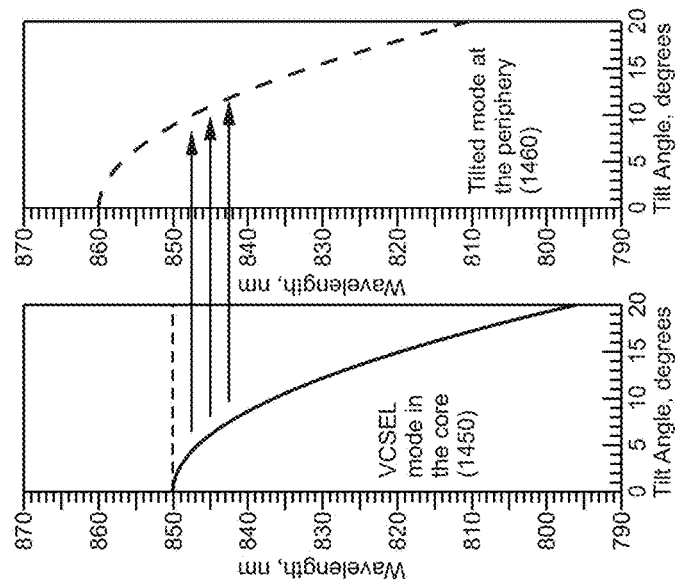
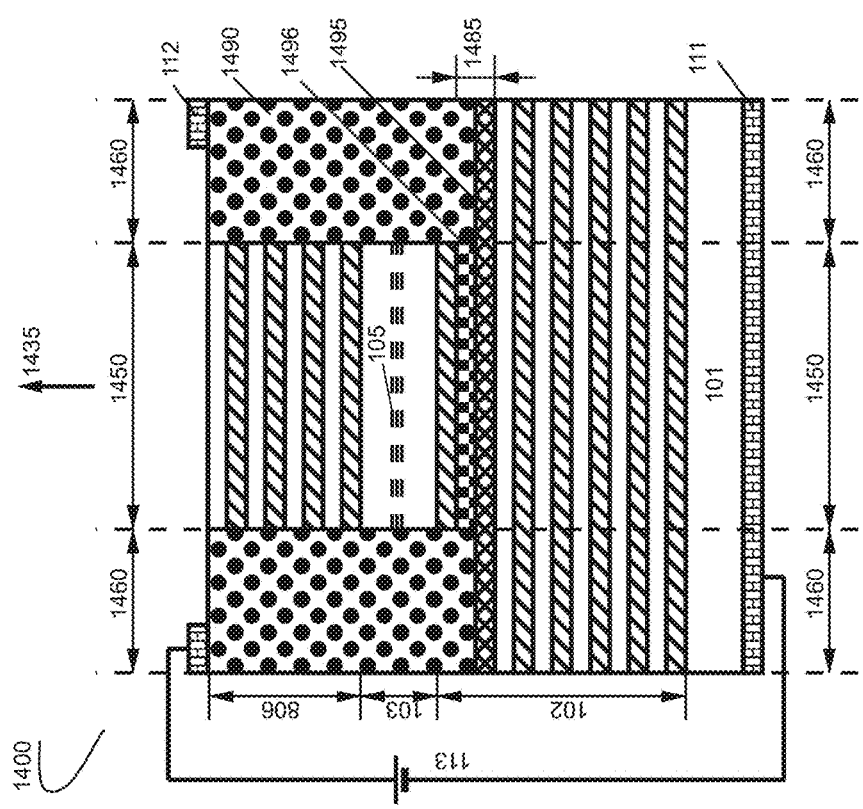
FIG. 14A.
FIG. 14B.

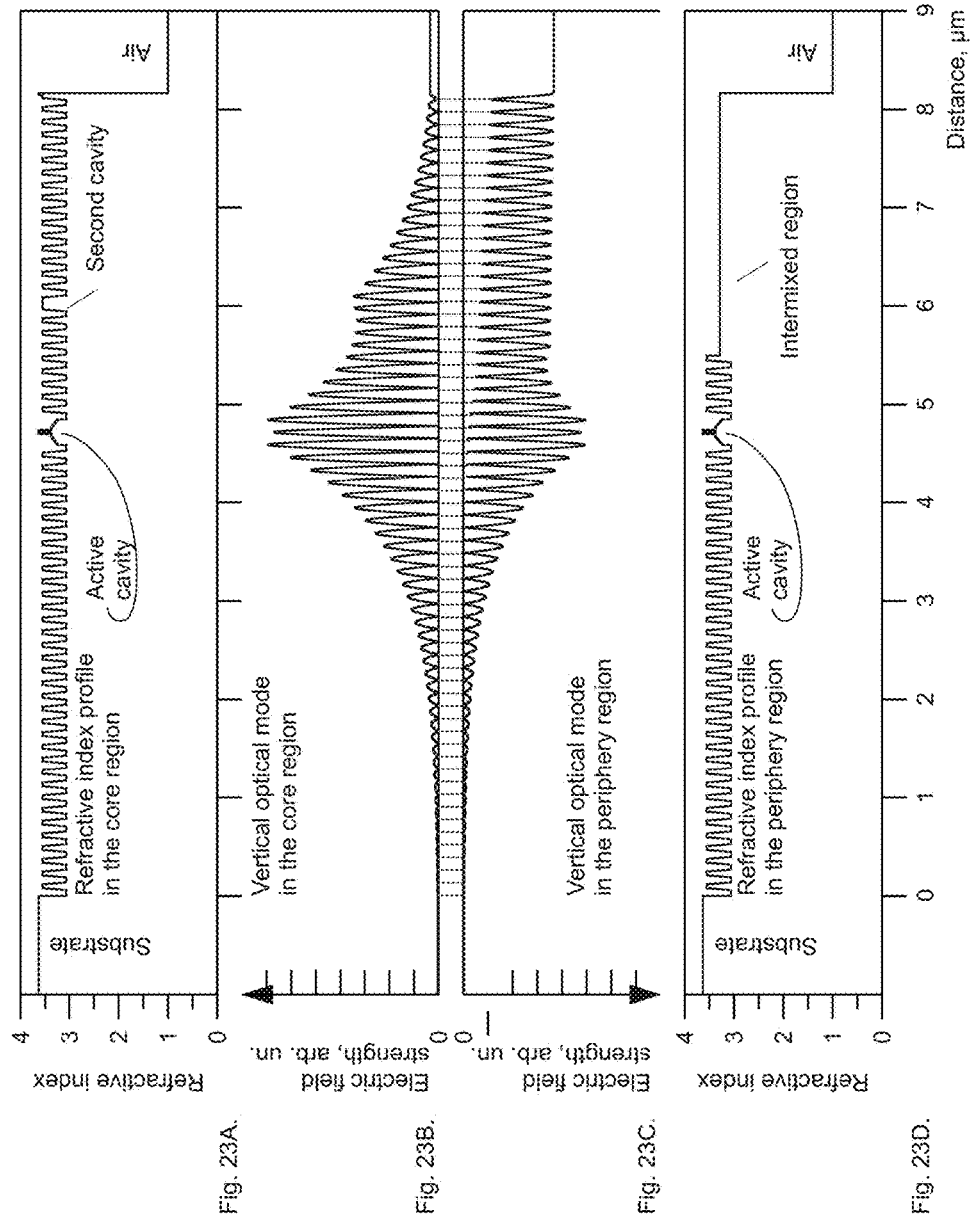

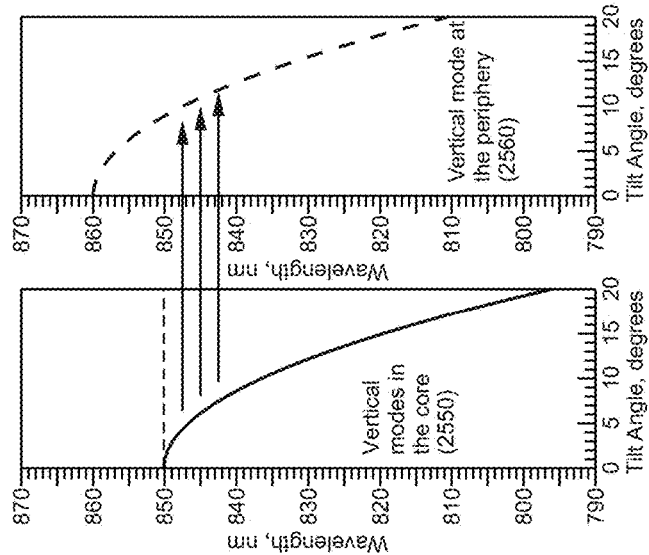
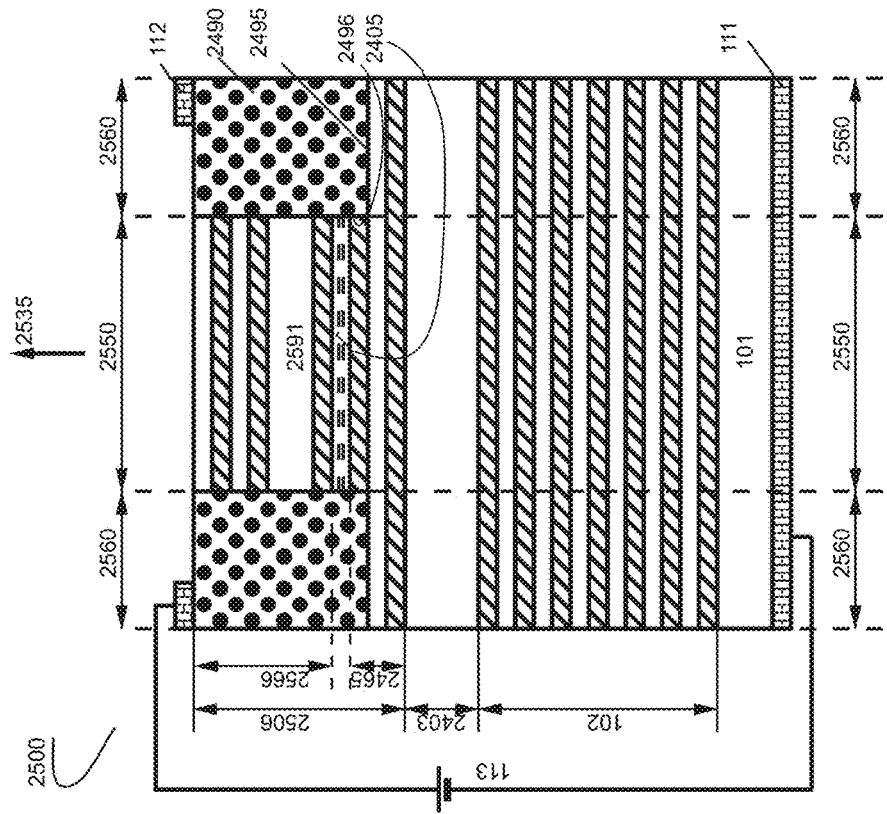
FIG. 25B.
FIG. 25A.

OPTOELECTRONIC DEVICE WITH ENHANCED LATERAL LEAKAGE OF HIGH ORDER TRANSVERSE OPTICAL MODES INTO ALLOY-INTERMIXED REGIONS AND METHOD OF MAKING SAME

REFERENCE TO RELATED APPLICATIONS

This is a continuation-in-part of U.S. patent application Ser. No. 13/771,875, filed Feb. 20, 2013, entitled: "Optoelectronic Device with Resonant Suppression of High Order Optical Modes and Method of Making Same". The aforementioned application is hereby incorporated herein by reference.

BACKGROUND OF THE INVENTION

Field of the Invention

The invention pertains to the field of optoelectronic devices. More particularly, the invention pertains to light emitting devices.

Description of Related Art

Light-emitting devices are presently broadly used in multiple applications, particularly in lighting, projection displays, sensing, material processing, optical storage, optical data transmission and in other applications. In case of light emitting devices the light may be emitted in a single or in multiple modes at the same or at different wavelengths. The devices may be designed to emit in the fundamental or high order transverse modes. Conventional narrow-stripe edge-emitting double heterostructure laser is typically designed to emit in the fundamental transverse mode. As opposite broad area edge-emitting lasers or industrial surface-emitting lasers emit typically in multiple transverse modes. Edge emitting tilted cavity lasers or tilted wave lasers are unique as they may emit in a single vertical high order transverse mode having a significant contribution of the $\vec{k}$-vector in the direction perpendicular to the plane of the layers. Also in this case laterally multimode operation is possible if the width of the stripe is large. At the same time, to ensure sufficient power of the device it is of utmost importance to have large surface area of the excitation region to avoid gain saturation and thermal roll-over effects. Importance of the relation between the output power and single mode operation can be illustrated by the vertical-cavity surface-emitting laser (VCSEL). The device contains gain medium, which is either excited by current injection or by photopumping. If the aperture region, where the excitation region is placed, is small, the device can emit in a single transverse mode at a fixed wavelength with a well-defined shape of the light beam and the field intensity maximum in the direction perpendicular to the surface. Once the size of the aperture increases beyond some critical value, excited transverse modes appear. This phenomenon is well explained in multiple books on VCSELs (e.g., Wilmsen, C., Temkin, H., and Coldren, L. A., eds. [*Vertical Cavity Surface Emitting Lasers. Design, Fabrication, Characterization, and Applications*], Section 2.3; Cambridge University Press, (1999)). In case of the multimode operation the device emits at several wavelengths and with a complex far field pattern composed of multiple lobes oriented in different directions. These phenomena make focusing to a single spot of the light coming out of the device hardly possible and adversely affects multiple applications like optical data transmission. Thus, it makes efficient coupling to a single mode fiber questionable. Similar problems occur also in tilted cavity laser, tilted wave laser, passive cavity laser, near-field laser. To overcome the problem of low single mode power of the VCSEL in some applications multiple lasers on a single wafer having small apertures are used. This allows achieving very high single mode power. However, as each laser emits independently, the resulting beam is not focusable to a small spot also in this case. To ensure single mode lasing in large aperture devices complex approaches are used. For example, applying of external resonators to semiconductor disc lasers gain significant interest. However, the need in a complex optical system makes the device bulky and expensive.

Multimode lasing in prior art VCSELs is illustrated in FIGS. 1 and 2. FIG. 1A shows a schematic cross-section of a prior art VCSEL wherein the current flow is controlled by an oxide-confined aperture. The VCSEL structure (100) contains a resonant cavity (103) sandwiched between a bottom distributed Bragg reflector (DBR) (102) and a top DBR (106). The structure is grown epitaxially on a substrate (101). The active medium (105) is introduced in the resonance cavity (103).

Both bottom DBR (102) and top DBR (106) are formed of alternating layers having a low and a high refractive indices. Both DBRs (102) and (106) and the resonant cavity (103) are formed of materials lattice-matched or nearly lattice-matched to the substrate (101). Further these materials should be transparent to the emitted light.

Active medium (105) can be formed of a double heterostructure, quantum wells, quantum wires, quantum dots of their various combinations. Insertions forming the active medium can be lattice-mismatched to the substrate as long as they are thin and do not create structural defects.

Typically the substrate (101) and the bottom DBR (102) are n-doped, the resonant cavity (103) is undoped, and the top DBR (106) is p-doped. The p-n junction is formed between the bottom DBR (102) and the top DBR (106). The bottom, or n-contact (111) is mounted on the n-doped substrate (101), and the top, or p-contact (112) is mounted on top of the p-doped top DBR (106). Once the forward bias (113) is applied to the p-n junction, the active medium generates optical gain and emits light. The resonant cavity (103) determines the wavelength of the emitted light provided the cavity resonance wavelength is within the gain spectrum of the active medium. The bottom DBR (102) and the top DBR (106) provide feedback to the generated light. For a device configured to emit light through the top DBR transparency of the top DBR is higher than the transparency of the bottom DBR. Once gain overcome losses lasing occurs, and the emitted light comes out (135) through the top DBR (106).

To minimize optical losses it is important to avoid generation of light in the active medium beneath the top contact. To prevent such effect and determine the path of the electric current through the active medium (105), oxide-confined aperture is introduced. One layer or several layers of $Ga_{1-x}Al_xAs$ with a high Aluminum composition (preferably higher than 95%) is selectively oxidized forming an amorphous oxide $Ga_{1-x}Al_xO_y$ (145). The oxide layers are insulating and thus they determine the path for the electric current such that the current does not flow through the active medium beneath the top contact. Further, the oxide layers reduce the capacitance of the device which is of key importance for high speed VCSELs. The oxide layers (145) formed within the top DBR (106) mark the non-oxidized core region, or aperture region (150), and an oxidized periphery region (160). Laser light is coming out (135) from the core region (or aperture region) (150).

In the co-pending U.S. patent application Ser. No. 13/771,875 it is shown that many of optical properties of a structure can be considered in a one-dimensional approximation, once a structure is mimicked by a planar multilayer structure infinitely extended in the lateral plane. It is further shown in U.S. Ser. No. 13/771,875 that the optical modes of such a planar multilayer structure can be represented in a form of dispersion curves, $$\lambda^{(i)} = \lambda^{(i)}(\vartheta), \quad (1)$$

where $\vartheta$ is the mode angle defined with respect to a chosen reference layer. FIG. 3A illustrates schematically such a structure (300) composed of the bottom DBR (102), a resonant cavity (103), and a top DBR (106). FIG. 3B shows as an example three dispersion curves of the (N−2)-nd, (N−1)-st, and N-th optical modes, A one skilled in the art will appreciate that, once N-th mode is the highest mode, the value $\lambda^{(N)}(0)$ is the wavelength of the VCSEL mode. In FIG. 3A this value is 850 nm. If one fixes this wavelength, it follows from FIG. 3B that (N−1)-st, (N−2)-nd modes correspond to non-zero angles and are, thus, tilted modes.

A one skilled in the art will agree that the wavelength of the fundamental mode of a VCSEL having finite dimensions in the lateral plane, the computation of which requires solving a two-dimensional problem for a cylindrically-symmetric device or a three-dimensional problem in the general case, will tend to its asymptotic value $\lambda^{(N)}(0)$ upon increase of the lateral dimensions of the device.

FIG. 1B shows the dispersion curves of the VCSEL modes in the planar multilayer structures mimicking the VCSEL (100). The left panel of FIG. 1B depicts the dispersion curve of the VCSEL mode in the non-oxidized core (150), and the right panel (260) demonstrates the dispersion curve in the oxidized periphery (160). As the oxide layers have the refractive index ~1.5-1.6 which is approximately twice lower than that of the semiconductor materials, the oxidation shifts the dispersion curve towards shorter wavelengths, as is shown in FIG. 1B on the right panel as compared to the left panel. That's why a spectral range occurs (shaded in FIG. 1B), for which the optical modes cannot leak from the core region to the periphery and are thus confined in the core. This fact results in multimode lasing of the VCSEL (100).

FIG. 2A illustrates another prior air VCSEL (200) wherein the path of the electric current is determined by proton bombardment. Protons are introduced into a part of the structure, rendering this region insulating. This governs the path of the electric current and prevents current flow through the regions of the active medium beneath the contacts. Upon proton bombardment, the device may be considered as consisting of a core region (250), in which no proton bombardment has been carried out, and a periphery (260), in which proton bombardment has been carried out forming a transformed domain (270) extended typically from the top surface of the device to a certain depth. In the top DBR (206) no oxide-confined aperture is introduced.

FIG. 2B shows the dispersion curves of the VCSEL mode in the planar multilayer structure mimicking the VCSEL of FIG. 2A. Dispersion curve on the left panel refers to the core structure, and the dispersion curve on the right panel refers to the periphery of the device. As proton bombardment introduces only a rather small change in the refractive indices, a real difference in refractive indices between core region, in which the current flows and the periphery region, where no current flows through the active medium, is due to heating in the core region. As heating results, generally, in an increase of the refractive index, the dispersion curve of the VCSEL mode in the core region (left panel of FIG. 2B) is shifted towards longer wavelengths as compared to the dispersion curve in the periphery (right panel of FIG. 2B). That's why a spectral range occurs (shaded in FIG. 2B), for which the optical modes cannot leak from the core region to the periphery and are thus confined in the core. This fact results in multimode lasing (235) of the VCSEL (200).

Several approaches to realize single mode VCSELs at relatively large aperture sizes was proposed (Y. A. Wu, G. S. Li, R. F. Nabiev, K. D. Choquette, C. Caneau, C. J. Chang-Hasnain, "Single-mode, passive antiguide vertical cavity surface emitting laser", IEEE Journal of Selected Topics in Quantum Electronics, Volume 1, pp. 629-637 (1995); U.S. Pat. No. 5,539,759, "Single mode laser with a passive antiguide region", by Chang-Hasnain et al., filed Oct. 4, 1994, issued Jul. 23, 1996, wherein both sources are incorporated herein by reference). In that case the VCSEL material around the aperture region was etched off and then overgrown by the material having a higher refractive index as referred in detail in the co-pending U.S. patent application Ser. No. 13/771,875. It is also argued that the latter approach is not always compatible to the standard oxide-confined VCSEL processing technology, which excludes any steps of overgrowth and, in any case, overgrowth of AlAs-containing material may be challenging. As opposite, formation of antiguiding surrounding of the aperture region by deposition of amorphous or polycrystalline materials may create interface defects, complicate yield and reduce reliability. Additional regions surrounding the VCSEL aperture are not compatible to the technology of selective oxidation of Al(Ga)As layers presently broadly used for VCSEL manufacturing.

An approach to single-mode VCSELs was proposed in the co-pending U.S. patent application Ser. No. 13/771,875. The approach is based on the enhancement of the lateral leakage of the optical modes based on engineering of oxide-confined apertures. FIG. 4 shows a schematic cross-section of a VCSEL (400) with engineered oxide apertures. On FIG. 4A, two oxide apertures (444) are placed in the top DBR (406). These apertures mark the non-oxidized core region, or aperture region (450), and the oxidized core region (460).

As it is shown in FIG. 3B, there are multiple optical modes in a planar multilayer structure, and the VCSEL mode has the maximum mode number N, and all modes with lower mode numbers (N−1), (N−2), etc. are tilted modes. FIG. 4B shows schematic dispersion curves of the VCSEL optical mode in the core and of a tilted optical mode of the periphery of the planar multilayer structure mimicking the core and the periphery of the VCSEL of FIG. 4A, respectively. All VCSEL modes of the core have, at the same wavelengths, their counterparts on the dispersion curve of the tilted mode in the periphery. Thus, leakage of the optical modes from the core to the periphery is possible.

FIGS. 5A through 5C show how the leakage from the VCSEL modes of the core to the tilted modes of the periphery manifests itself in the optical power reflectance spectra of the structure. FIG. 5A represents the optical power reflectance spectrum of the VCSEL structure in the core region at normal incidence of light revealing two dips within the reflectivity stopband, one at 850 nm, and another one at 883 nm. FIG. 5B shows the optical power reflectance spectrum of the VCSEL structure at the oxidized periphery at the normal incidence of light. Due to the lowering of the refractive index of the oxides with respect to the index of semiconductor, both dips are shifted towards shorter wavelengths, to 841 nm and 864 nm, respectively. The key point is that the dip at a longer wavelength is still positioned at a wavelength longer than 850 nm. It means, that, at an oblique incidence, that dip will match 850 nm. Thus, FIG. 5C shows the optical power reflectance spectrum of the VCSEL structure in the oxide region at oblique incidence of light. Tilt angle is 10 degrees defined in the layer $Ga_{0.85}Al_{0.15}As$. The two consecutive short wavelength shifts of the dips of the optical power reflectance spectrum are illustrated by dash-dotted straight and curved lines, respectively.

Focusing on two of the three figures, namely on FIGS. 5B and 5C, a following note should be given. The optical mode existing in the oxide region of the VCSEL structure at the wavelength 864 nm as the vertical optical mode, exists also at the wavelength 850 nm, at which this mode is a tilted optical mode having the tilt angle in the layers $Ga_{0.85}Al_{0.15}As$ equal to 10 degrees.

FIGS. 6A through 6D compare the two optical modes of the VCSEL structure calculated at the same wavelength 850 nm. FIG. 6A shows the refractive index profile in the core region of the VCSEL structure. FIG. 16(b) shows the electric field strength profile of the vertical optical mode of the VCSEL structure in the core (non-oxidized) region. FIG. 6C displays the electric field strength profile of the tilted optical mode of the VCSEL structure in the periphery region. Finally, FIG. 6D displays the refractive index profile of the VCSEL structure in the periphery (oxidized) region.

It should be noted that the plot of FIG. 6C is inverted. The absolute values of the optical field strength that are the positive numbers are displayed in the downward vertical direction. This is done for convenience. In such a way it is more convenient to compare the nodes of the two optical field profiles. To make such a comparison, each node of the optical field profile of FIG. 6C is connected by a dashed line with the closest node of the optical field profile of FIG. 6B. One can notice that the optical field profile of FIG. 6B contains one extra node.

If the two optical modes having different number of nodes are calculated for the same refractive index profile, the electric field profiles are orthogonal. However, as the refractive index profile in the core region and in the periphery region are different, the orthogonality is broken, and the modes of FIG. 6B and FIG. 6C are no longer orthogonal.

A one skilled in the art will appreciate that the optical modes in a planar multilayer structure similar to that of FIG. 3A are eigenmodes of the one-dimensional wave equation. This equation for transverse electric modes has the form:

$$-\frac{d^2}{dz^2}E_y(z) - \left(\frac{2\pi}{\lambda}\right)^2 n^2(z)E_y(z) = -\left(\frac{2\pi}{\lambda}\right)^2 n_{eff}^2 E_y(z). \quad (2)$$

Here z is the vertical direction perpendicular to the layers, $n_{eff}$ is the effective refractive index of the optical mode related to the mode angle as follows:

$$n_{eff} = n_{reference\ layer} \cdot \sin\vartheta. \quad (3)$$

The two different eigenmodes of Eq. (2) calculated for the same refractive index profile obey the following orthogonality criterion:

$$\int (E_y^{(j)})^*(z)n^2(z)(E_y^{(i)})(z)dz = 0, \text{ if } j \neq i \quad (4)$$

Once the optical modes calculated for two different optical profiles are considered, the integral $$\int (E_y^{(j)(periphery)})^*(z)n^{(periphery)}(z)n^{(core)}(z)(E_y^{(i)(core)})(z)dz \neq 0 \quad (5)$$

does not vanish and can be regarded as a measure of the orthogonality breakdown.

A following note should be given. The overlap integral (5) gives just a semi-quantitative measure of the lateral leakage of the optical modes from the core to the periphery. Exact evaluation of the leakage losses and the corresponding modal lifetime requires solving a two-dimensional problem (for cylindrically symmetric structures) or a three-dimensional problem for a general shape structure.

As the overall thickness of the oxide layers is small compared to the thickness of the structure, and as the relative oscillations of the refractive index of the semiconductor materials (~14%) is small compared to the oscillations of the electric field (100%), a one skilled in the art will appreciate that the overlap integral $$\int (E_y^{(j)(periphery)})^*(z)(E_y^{(i)(core)})(z)dz \quad (6)$$

can also be considered as a semi-quantitative measure of the lateral leakage.

To quantify the overlap integrals, it is useful to normalize both (5) and (6). The normalized overlap integral of Eq. (5) equals:

$$W_{ji}^{(1)} = \frac{\left|\int (E_y^{(j)(periphery)})^*(z)n^{(periphery)}(z)n^{(core)}(z)(E_y^{(i)(core)})(z)dz\right|^2}{\int |E_y^{(j)(periphery)}(z'')|^2 n^{(periphery)2}(z'')dz'' \times \int |E_y^{(i)(core)}(z')|^2 n^{(core)2}(z')dz'}. \quad (7)$$

The normalized overlap integral of Eq. (6) has the form $$W_{ji}^{(2)} = \frac{\left|\int (E_y^{(j)(periphery)})^*(z)(E_y^{(i)(core)})(z)dz\right|^2}{\int |E_y^{(j)(periphery)}(z'')|^2 dz'' \times \int |E_y^{(j)(core)}(z')|^2 dz'}. \quad (8)$$

Evaluation of the overlap integral between the modes of FIGS. 6B and 6C according to both definitions yields two close values: $W_{ji}^{(1)}=38.1\%$, and $W_{ji}^{(2)}=36.0\%$ confirming once again that both definitions give reasonable semi-quantitative measure of the orthogonality breakdown.

A one skilled in the art will appreciate that the enhanced leakage has different impact on different transverse, or lateral modes. Typically, high-order lateral optical modes are located closer to the periphery of the aperture region, i.e. to the border between the aperture region and the oxide region, whereas the fundamental lateral mode is located rather in the central part of the aperture region. Then the leakage losses of the high-order lateral optical modes will be larger than the losses of the fundamental lateral optical mode. Therefore, if a broad aperture region supports a plurality of the lateral optical modes, the high-order lateral optical modes, existing in the structure, have larger leakage losses than the fundamental lateral optical mode. This feature promotes single mode lasing from a VCSEL with a broad aperture.

FIG. 7 shows a schematic cross-section of duo cavity VCSEL (700) with coupled cavity. The second cavity (791) is placed within the top DBR (706), such that the active cavity (103) and the second cavity (791) are optically coupled. As the resonant wavelength of each cavity can be controlled by its thickness, both cavities can be configured such that the vertical mode of the second cavity has a longer wavelength than that of the active cavity. Then, in the coupled cavity device (700), the second cavity mode is a tilted mode of the coupled structure.

The oxide confined aperture (145) marks the non-oxidized core (750) and the oxidized periphery (760) of the device. A possibility of the leakage of the optical modes can again be considered by means of a planar multilayer structure mimicking the coupled cavity VCSEL (700) of FIG. 7A. A one skilled in the art will agree that it is further possible to configure both cavities and the oxide confined aperture such that, in a planar multilayer structure the wavelength of the second cavity mode at the periphery, already shifted due to oxidation to shorter wavelengths is still at a longer wavelength than the VCSEL cavity mode of the core. Then, as it is shown in FIG. 7B, leakage of the optical modes from the core to the periphery is possible. Such leakage promotes emission of single transverse mode laser light (735) from the VCSEL.

The concept of the engineering of oxide confined apertures enhancing lateral leakage of high-order transverse modes disclosed in the co-pending U.S. patent application Ser. No. 13/771,875 was confirmed by the exact two-dimensional modeling in a cylindrically symmetric VCSEL (V. Shchukin, N. N. Ledentsov, J. Kropp, G. Steinle, N. Ledentsov, Jr., S. Burger, and F. Schmidt, "Single-Mode Vertical Cavity Surface Emitting Laser via Oxide-Aperture-Engineering of Leakage of High-Order Transverse Modes", IEEE Journal of Quantum Electronics, volume 50, issue 12, pp. 990-995, December 2014, wherein this publication is hereby incorporated herein by reference). Further, experimental studies of such VCSEL reported in that publications confirmed single mode lasing of the 850 nm VCSEL up to the aperture diameter of ~5 μm.

However, the so far reached increase in the aperture diameter allowing single mode lasing is still not sufficient, and there is a need in further improvement or in finding alternative or additional way to promote single mode lasing from a VCSEL.

SUMMARY OF THE INVENTION

An optoelectronic device is disclosed, which operation is based on a change of the refractive index profile upon selective chemical transformation. Selective chemical transformation occurs beneath openings in a lithographic mask and can be activated by selective implantation of impurities, selective diffusion of impurities, selective implantation of point defects, selective diffusion of point defects, selective laser annealing, or a combination of these processes. Impurity atoms like Zinc or Silicon can be applied for such process. Upon selective process of chemical transformation, the device consists of a core region in which no chemical transformation has occurred and a periphery subject to such process of chemical transformation. Alloy compositional intermixing of a multilayer structure is an example of such chemical transformation process. A selective transformation of the chemical profile results in the formation of a vertical profile of the refractive index in the periphery region of the device distinct from the vertical refractive index profile of the core region of the device. Due to a difference in refractive index profiles in the two adjacent regions, the operational vertical optical mode in the core region is no longer orthogonal to a one or to a plurality of the modes of the continuum spectrum in the periphery region. The break of the orthogonality enables lateral leakage of the optical mode from the core to the periphery. High order transverse optical modes associated to the vertical operational mode of the device have higher lateral leakage losses to the periphery than the fundamental transverse optical mode, thus supporting single transverse mode operation of the device. This approach applied to vertical cavity surface emitting lasers (VCSELs) allows fabrication of single transverse mode VCSELs with a broad aperture. Lateral leakage of the laser light from the core region to the periphery allows arrays of laterally coupled VCSELs, single transverse mode edge-emitting lasers with an extended stripe width as well as laterally coupled laser bars.

BRIEF DESCRIPTION OF THE DRAWINGS

In FIGS. 5A through 5C a double stage shift of the dips is shown. First, the two dips of the optical power reflectance spectrum of the VCSEL shift towards shorter wavelengths due to replacement of semiconductor layer or layers by oxide layer(s) having a lower refractive index. Dash-dotted tilted straight lines connect the corresponding features in FIGS. 5A and 5B. Second, the two dips further shift towards shorter wavelengths because of a tilt angle of incidence of light. Dash-dotted curves connect the corresponding features in FIGS. 5B and 5C. The angle of incidence is chosen such that the long wavelength dip in FIG. 5C is positioned at 850 nm. The vertical dashed line demonstrates, that the dip in the optical power reflectance spectrum of the VCSEL structure calculated for the aperture core region at normal incidence, on the one hand, and the long wavelength dip in the optical reflectance spectrum calculated for the oxidized periphery region at oblique incidence, on the other hand, coincide.

FIGS. 6A through 6D compare the electric field strength profiles for the optical modes of the vertical cavity surface emitting laser (VCSEL) of FIG. 4A, calculated for the same wavelength of 850 nm, one mode being the vertical optical mode in the non-oxidized core region, and the other being the tilted optical mode in the oxidized periphery region. FIG. 6A shows the refractive index profile in the non-oxidized core region.

FIG. 6B depicts the electric field strength profile of the vertical optical mode of the core region of the VCSEL of FIG. 4A.

FIG. 6C demonstrates the electric field strength profile of the optical mode of the VCSEL of FIG. 4A calculated for the periphery region and the mode tilt angle of 10 degrees, defined for a $Ga_{0.85}Al_{0.15}As$ layer. Each of the nodes of the electric field profile of the tilted mode of FIG. 6C is connected by a dashed line to the nearest node of the electric field profile of the vertical mode of FIG. 6B. The vertical mode has one extra node. However, difference in refractive index profiles in the non-oxidized core region and in the oxidized periphery region results in redistribution of the electric field strength profile, and hence in the break of orthogonality between the two modes of FIGS. 6B and 6C, thus enabling leakage of the optical modes from the core to the periphery.

FIG. 6D yields the refractive index profile in the oxide region of the VCSEL of FIG. 4A.

FIGS. 9A through 9D illustrate schematically different ways of the chemical transformation of a semiconductor alloy subject to impurity diffusion. FIG. 9A shows schematically the alloy composition profile of a multilayer alloy structure in the structure region not subject to the chemical transformation (core region).

FIG. 9B refers to the case where the chemical transformation is an alloy compositional intermixing evolving towards formation of a homogeneous alloy. FIG. 9B illustrates an intermediate stage of the alloy compositional intermixing in which the alloy composition profile reduces its amplitude and smoothens as compared to FIG. 9A.

FIG. 9C shows schematically the alloy composition profile of a multilayer alloy structure in the structure region not subject to the chemical transformation (core region) repeating FIG. 9A.

FIG. 9D refers to the case where a particular chemical transformation is the phase separation of the alloy. FIG. 9D illustrates an intermediate stage of the phase separation wherein the amplitude of alloy composition variations have enhanced as compared to the initial state of FIG. 9C.

FIGS. 11A through 11D compare the electric field strength profiles for the optical modes of the vertical cavity surface emitting laser (VCSEL) of FIG. 8A, calculated for the same wavelength of 850 nm, one mode being the vertical optical mode in the core region, and the other being the vertical optical mode in the periphery region in which chemical transformation has occurred. FIG. 11A shows the refractive index profile in the core region (not intermixed).

FIG. 11B depicts the electric field strength profile of the vertical optical mode of the core region of the VCSEL of FIG. 8A.

FIG. 11C demonstrates the electric field strength profile of the optical mode of the VCSEL of FIG. 8A calculated for the periphery region in which chemical transformation has occurred, and such chemical transformation is alloy compositional intermixing. The mode profile repeats the profile of the VCSEL optical mode of FIG. 11B in the non-intermixed layers of the periphery and is a combination of two travellin planar waves in the intermixed layers of the periphery. Each of the local field minima of the field profile of FIG. 11C is connected by a dashed line to the nearest local field minimum of the field profile of FIG. 11B. Both field profiles have the same number of nodes. However, as the profile of FIG. 11C in the intermixed layers of the periphery has a different shape than the profile of FIG. 11B in the same layers in the core, the overlap between the two profiles is less than 100%.

FIG. 11D yields the refractive index profile in the partially intermixed periphery region of the VCSEL of FIG. 8A.

FIG. 14A shows schematically a cross-section of a vertical cavity surface emitting laser (VCSEL) subject to transformation of the chemical profile in the periphery region, wherein several layers of selected alloy composition are added in the region where a p-n junction between the non-transformed and transformed parts of the periphery is formed, aimed at an increase of the opening voltage, according to another embodiment of the present invention, FIG. 14B shows schematically dispersion curves of a VCSEL optical mode of the core region and of a tilted optical mode of the periphery region of a planar multilayer structure mimicking the core and the periphery regions of the VCSEL of FIG. 14A. The transformation of the chemical profile in the periphery region enables leakage of the optical modes from the core to the periphery.

FIG. 19A shows the vertical refractive index profile of the edge-emitting laser of FIG. 18A in the core region where no chemical transformation has occurred. The profile contains two coupled waveguides, and the quantum well-based active medium is located in the bottom (active) waveguide.

FIG. 19B shows the vertical profile of the mode #1 (fundamental mode) of the structure of FIG. 19A. The mode is predominantly located in the passive waveguide.

FIG. 19C shows the vertical profile of the mode #2 (a next high-order mode) of the structure of FIG. 19A. The mode is predominantly located in the active waveguide. This is the mode having the maximum optical confinement factor in the active medium, i.e. this is the lasing mode.

FIG. 19D shows the dispersion curves of the modes #1 and #2 in the planar multilayer structure mimicking the core of the edge-emitting laser of FIG. 18A.

FIG. 19E shows the vertical refractive index profile of the edge-emitting laser of FIG. 18A in the periphery region, in which alloy compositional intermixing has occurred resulting in the vanishing of the passive waveguide and formation of a new top cladding having a significantly smaller refractive index step with respect to the active waveguide.

FIG. 19F shows the vertical profile of the mode #1 (fundamental mode) of the structure of FIG. 19E. The fundamental mode in the periphery is predominantly located in the active waveguide.

FIG. 19G shows the dispersion curve of the mode #1 in the planar multilayer structure mimicking the periphery of the edge-emitting laser of FIG. 18A. The dispersion curve is located at larger angles compared with the dispersion curve of the lasing mode #2 in the core. According to FIGS. 4B, 7B, 8B, 12B, and 14B this implies that the lasing mode #2 can leak from the core to the periphery.

In FIGS. 22A through 22C a double stage shift of the dips is shown. First, the VCSEL dip of the active cavity shifts towards longer wavelengths due to vanishing of the second cavity upon alloy compositional intermixing. Dash-dotted tilted straight line connects the corresponding features in FIGS. 22A and 22B. Second, the dip shifts towards shorter wavelengths because of a tilt angle of incidence of light. Dash-dotted curves connect the corresponding features in FIGS. 22B and 22C. The angle of incidence is chosen such that the overall shift is zero and the dip calculated for the oblique incidence in the periphery region matches the dip calculated for the core region at normal incidence (at 850 nm). The vertical dashed line demonstrates that the dip in the optical power reflectance spectrum of the VCSEL structure calculated for the core region at normal incidence, on the one hand, and the dip in the optical reflectance spectrum calculated for the periphery region at oblique incidence, on the other hand, coincide.

FIGS. 23A through 23D compare the electric field strength profiles for the optical modes of the vertical cavity surface emitting laser (VCSEL) of FIG. 23A, calculated for the same wavelength of 850 nm, one mode being the vertical optical mode in the core region, and the other being the vertical optical mode in the periphery region. FIG. 23A shows the refractive index profile in the core region.

FIG. 23B depicts the electric field strength profile of the vertical optical mode of the core region of the VCSEL of FIG. 21A.

FIG. 23C demonstrates the electric field strength profile of the optical mode of the VCSEL of FIG. 21A calculated for the periphery region and the mode tilt angle of 9.3 degrees, defined for a $Ga_{0.85}Al_{0.15}As$ layer. Each of the nodes of the electric field profile of the vertical mode of FIG. 23C is connected by a dashed line to the nearest node of the electric field profile of the vertical mode of FIG. 23B. Both profiles have the same number of nodes, and, hence, a large overlap integral.

FIG. 23D yields the refractive index profile in the oxide region of the VCSEL of FIG. 21A.

FIG. 25A shows schematically a cross-section of a duo cavity passive cavity surface-emitting laser, emitting laser subject to transformation of the chemical profile in the periphery region, wherein the transformation is the alloy compositional intermixing and it occurs through the second cavity and through the active medium down to a part the bottom distributed Bragg reflector, wherein no transformation occurs in the first passive cavity, according to yet another embodiment of the present invention.

FIG. 25B shows schematically dispersion curves of a vertical optical mode of the core region and of the vertical optical mode of the periphery region of a planar multilayer structure mimicking the core and the periphery regions of the passive cavity surface emitting laser of FIG. 25A. The alloy compositional intermixing in the periphery region results in a shift of the vertical optical mode towards longer wavelengths and enables leakage of the optical modes from the core to the periphery.

DETAILED DESCRIPTION OF THE INVENTION

The present patent application discloses an alternative way to enhance leakage losses of the high-order transverse optical modes and thus to promote single transverse mode lasing. Technology of selective chemical transformation of the semiconductor structure is known in the Art. There are several processes that can be activated beneath the openings in a lithographic mask. One process is implantation of impurities. Another process includes diffusion of impurities from the surface. Such elements like Zinc or Silicon are commonly used. Yet another process includes implantation of point defects (an example is implantation of excess ions of Gallium). A further process includes diffusion of point defects like vacancies from the surface. Another process includes selective laser annealing. The purpose of all these properties is to selectively alter the chemical profile in the vertical directions beneath selective areas on the surface such that a domain of chemical transformation occurs. The side boundaries of such domain are controlled by the mask, the top boundary if commonly the surface of the structure (but also can be lower), and the bottom boundary can be varied by choosing particular regimes like temperature of the process, amount of excess atoms introduced, duration etc.

One of the commonly known type of chemical transformation of this type is alloy compositional intermixing, wherein a structure starting from alloy composition profile in the vertical direction evolves towards an alloy with the uniform composition. Alloy compositional intermixing is frequently applied once there is, for example, a need to form a periphery region of a semiconductor material having a broad band gap surrounding a core structure with a narrower band gap.

Figure 8B:
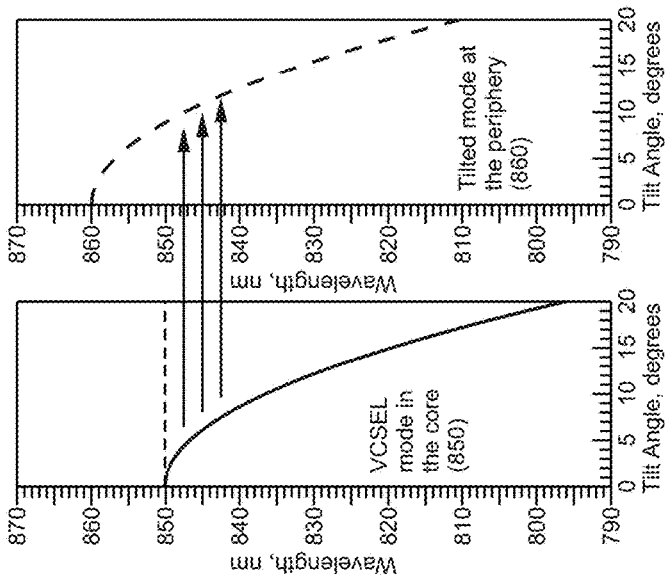
FIG. 8B shows schematically dispersion curves of a VCSEL optical mode of the core region and of a tilted optical mode of the periphery region of a planar multilayer structure mimicking the core and the periphery regions of the VCSEL of FIG. 8A. The transformation of the chemical profile in the periphery region enables leakage of the optical modes from the core to the periphery.
Figure 8A:
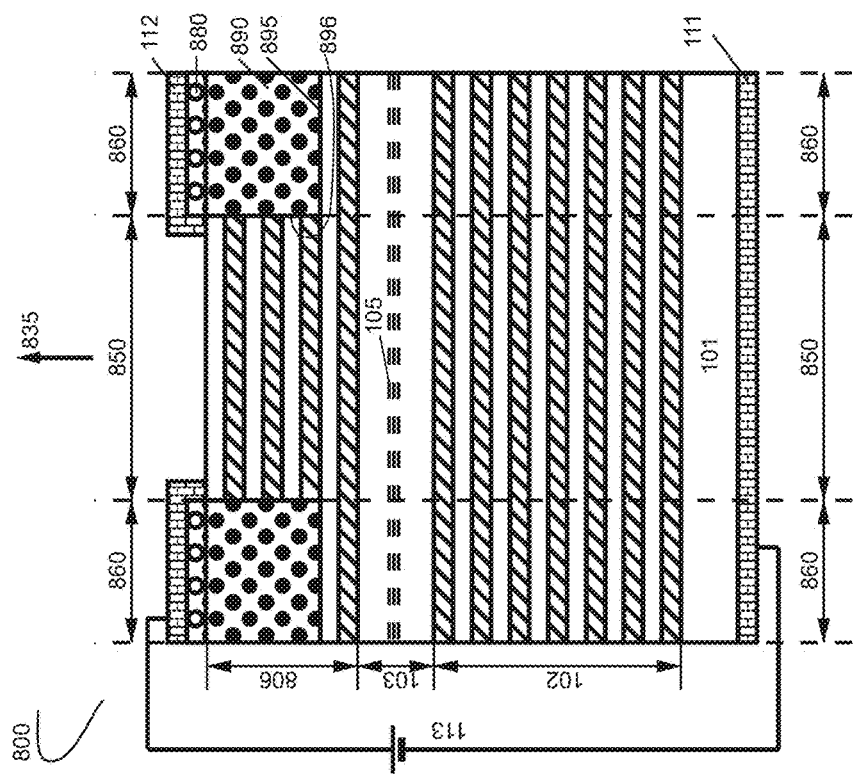
FIG. 8A shows schematically a cross-section of a vertical cavity surface emitting laser (VCSEL) subject to a selective chemical transformation process resulting in a transformation of the chemical profile in the periphery region, according to an embodiment of the present invention.

In the present disclosure a new application of the process of selective chemical transformation is employed. Selective chemical transformation is applied to control the optical modes of the laser structure. FIG. 8A shows schematically a cross-section of a VCSEL (800) according to an embodiment of the present invention. Selective chemical transformation is applied to a part of the top DBR (806), resulting in the formation of a chemically transformed region (890). The chemically transformed region determines the core of the device (850) and the periphery (860) in which the chemical transformation occurs. The transformed region (890) is thus the top part of the device periphery. On the bottom the transformed region (890) is bounded by the boundary (895) separating the transformed region (890) and non-transformed part of the top DBR (806). The side boundary (896) separates the core (850) of the device and the transformed region (890).

In the embodiment (800), the bottom DBR (102) is n-doped, and the top DBR (806) is p-doped. The transformed region (890) is formed by diffusion of a donor impurity, or an n-impurity. A one skilled in the art will appreciate that silicon can be applied as silicon introduced into a semiconductor structure formed of III-V semiconductor materials is an n-impurity. As initially a part of the top DBR (806) was p-doped, it is important that the concentration of the n-impurity exceeds the initial level of p-doping overcompensating the material rendering it n-doped. The dielectric layer (880) separates the n-doped transformed region (890) from the p-contact (112).

Once in a part of the periphery (860), namely in the region (890), chemical transformation has occurred, the refractive index profile in the vertical direction at the periphery (860) is different from the refractive index profile in the vertical direction in the core (850). Therefore, similarly to co-pending U.S. patent application Ser. No. 13/771,875, the orthogonality between the VCSEL mode in the core and a one or several tilted modes at the periphery is broken, which enables leakage of the VCSEL mode from the core to the periphery as illustrated in FIG. 8B.

FIGS. 9A and 9B illustrate a possible change of the alloy composition profile upon chemical transformation for the case, where such chemical transformation is alloy compositional intermixing. Once the structure, prior to intermixing is composed of an alloy material $A_{1-c}B_cD$ ($Ga_{1-c}Al_cAs$ as an example) with alternating alloy composition, wherein layers having a composition $c_1$ and a thickness $d_1$ alternates with layers having a composition $c_2$ and a thickness $d_2$. Then, the compete alloy compositional intermixing results in the formation of a homogeneous alloy with the alloy composition $$\bar{c} = \frac{c_1 d_1 + c_2 d_2}{d_1 + d_2}. \quad (9)$$

Once the alloy compositional intermixing is not complete, alloy composition remains modulated, but its profile smoothens and the modulation amplitude decreases as shown in FIG. 9B.

A one skilled in the art will appreciate that some semiconductor alloys have a miscibility gap, wherein a homogeneous alloy in the certain range of compositions and at certain temperatures is thermodynamically unstable. Alloys $Al_{1-x}In_xAs$ and $Ga_{1-x}In_xAs_{1-y}P_y$ are known as examples. In this case processes like implantation or diffusion of impurities which enhances the bulk mobility of the main atoms constituent the semiconductor materials activate the trend to alloy phase separation. FIGS. 9C and 9D illustrate this case. The alloy composition profile in FIG. 9C refers to the structure prior to diffusion of impurities. Upon diffusion of impurities, phase separation process starts, and the amplitude of composition modulation increases as illustrated in FIG. 9D.

Alloy phase separation, also as alloy compositional intermixing results in a change of the refractive index profile and in breakdown of the orthogonality of the optical modes in two neighboring parts of the structure (core and periphery) and thus enabling leakage of the optical modes from the core to the periphery and thus promoting single transverse mode lasing.

Figure 10:
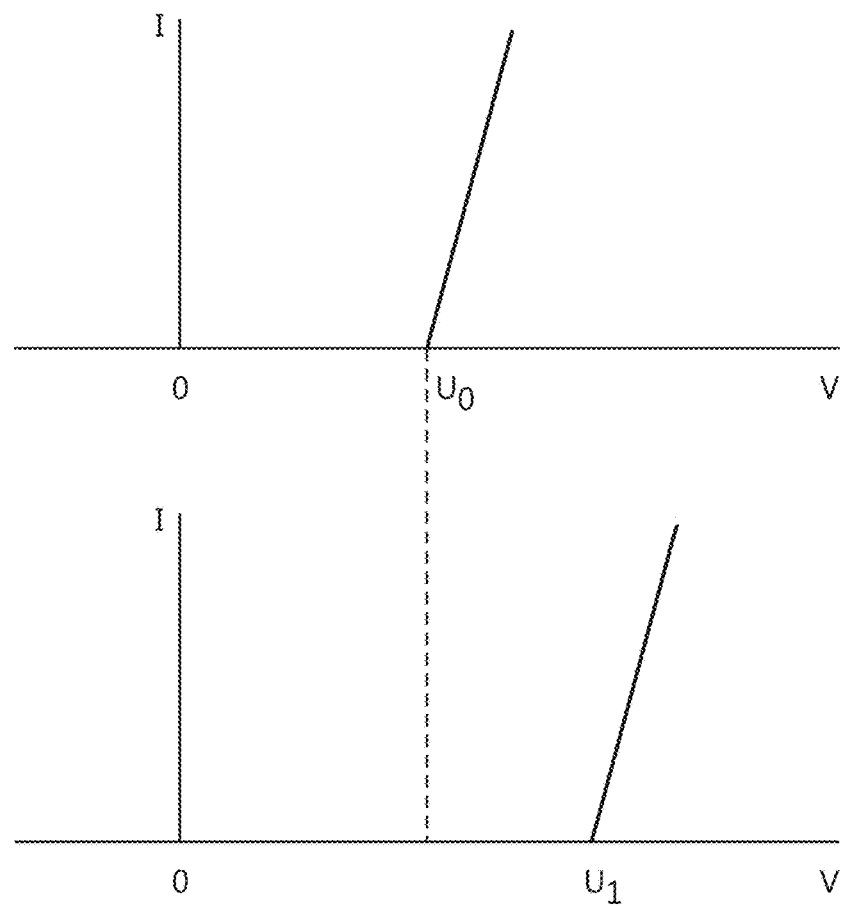
FIG. 10 shows schematically the I-V curve of the p-n junction containing the quantum well active medium (top panel) and the I-V curve of the p-n junction in the passive region at the periphery between the non-transformed and transformed parts of the periphery (bottom panel).

FIG. 10 explains how the current flow occurs through the VCSEL (800) of FIG. 8A. The p-n junction located between the p-doped top DBR (806) and the n-doped bottom DBR (102) contains the active medium. The I-V curve of this p-n junction is shown on the top panel of FIG. 10. Upon applying a forward bias (113), the I-V curve opens once the voltage exceeds the opening voltage $V_0$. A one skilled in the art will agree that the opening voltage is determined by the energy spectrum of the active medium and, approximately, by the photon energy of the emitted laser light, $$V_0 = E_{photon}/|e|, \quad (10)$$

where $|e|$ is the elementary charge. The I-V curve of the second p-n junction existing between the n-doped chemically transformed region (890) and the p-doped DBR (806) is not biased, and there is no current flow through the boundaries (895) and (896) between the chemically transformed region (890) and the top DBR (806). Thus, the current flows only in the core region (850), and no generation of the light occurs beneath the top contact.

FIGS. 11A through 11D compare the two optical modes of the VCSEL structure of FIG. 8A calculated for the same wavelength 850 nm. FIG. 11A shows the vertical refractive index profile in the core region of the device. FIG. 11B shows the vertical electric field strength profile of the vertical optical mode of the core of the device. FIG. 11D shows the vertical refractive index profile in the periphery region of the device. The profile of FIG. 11D includes the region in which the alloy compositional intermixing has occurred forming a homogeneous alloy with a constant refractive index having some intermediate value between the low index and the high index of the DBR. Once the average alloy composition is conserved upon intermixing, the refractive index of the intermixed layer approximately equals to the averaged refractive index of the DBR. Thus the spectral position of the vertical mode remains nearly unchanged upon intermixing. FIG. 11C depicts the vertical electric strength profile of the vertical mode in the periphery region which has undergone alloy compositional intermixing.

It should be noted that the plot of FIG. 11C is inverted. The absolute values of the optical field strength that are the positive numbers are displayed in the downward vertical direction. This is done for convenience. In such a way it is more convenient to compare the nodes of the two optical field profiles. To make such a comparison, each node (or each local minimum) of the optical field profile of FIG. 11C is connected by a dashed line with the closest node of the optical field profile of FIG. 11B. One can notice that the optical field profiles of FIGS. 11B and 11C contain the same number of the nodes. However, the profile of FIG. 11C is drastically changed compared to that of FIG. 11B. The optical field profile of FIG. 11C in the non-transformed part of the periphery, namely in the bottom DBR, in the resonant cavity and in the small part of the top DBR adjacent to the cavity repeats that of FIG. 11b, but is reduced by a certain factor, whereas the field profile in the transformed (intermixed) part of the periphery is a combination of the outwards travelling plane wave and the travelling wave reflected from the semiconductor/air interface. It should be noted that the optical field profiles of FIG. 11B and FIG. 11C have equal number of nodes. However, due to the transformation of the field profile in the intermixed region, the overlap integral of these two modes is less than 100%. Evaluation of the overlap integral for the particular profiles of FIGS. 11B and 11C yields the overlap of 80% (two definitions of Eqs. (7) and (8) give even closer values than those for the fields of FIGS. 6B and 6C, with a difference below 1%, namely $W_{ji}^{(1)}=80.1\%$, and $W_{ji}^{(2)}=79.5\%$).

A one skilled in the art will appreciate that, for a given optical mode of the core, the sum of the overlap integrals of this mode with all the modes of the periphery always remains 100%. Therefore, once the overlap integral of the vertical mode in the core (FIG. 11B) with the vertical mode of the periphery (FIG. 11C) reduces from 100% down to 80% the sum of the overlap integrals of the vertical mode of the core with all the rest modes, i.e. with all the tilted modes of the periphery increases up to 20%. Depending on particular epitaxial structure and particular depth of the alloy compositional intermixing there may exist cases where the overlap integral of the vertical mode of the core with a single tilted mode of the periphery is large, like in FIGS. 6B and 6C. In other cases, the overlap integral of the vertical mode of the core with every single tilted mode of the periphery is small, but because of a large number of tilted modes, the overall leakage losses of the vertical mode of the core are significant.

FIG. 12 shows a schematic cross-section of a VCSEL (1200) according to another embodiment of the present invention. The chemical transformation is activated by the diffusion of a p-type impurity into the p-doped top DBR. Thus the chemically transformed region (1290) is doped by a p-type impurity. In the embodiment of FIG. 12 the p-type impurity is Zinc. In order to form the targeted path for the current, oxide confined aperture (1245) is formed by the selective oxidation of $Ga_{1-x}Al_xAs$ layer, with a high composition of Aluminum (preferably 95% or higher) and its transformation into an amorphous oxide of $Ga_{1-x}Al_xO_y$ layer. As the oxide layer is an electric insulator, no current flow occurs through the active medium beneath the top contacts.

As the boundaries (1295) and (1296) of the transformed region (1290) are the boundaries between the p-doped DBR (1206) and the p-doped transformed region (1290), no p-n junction is formed at the boundary.

A one skilled in the art will appreciate that the lateral structures formed by the chemical transformation (1290) and by selective oxidation of (1245) may form two different lateral dimensions, and a certain relation between two diameters should be met to promote proper functionality of the device. If the diameter of the oxide confined aperture (1245) is significantly smaller (by 1 micrometer or more) than the diameter of the core structure (1250), the optical modes are controlled by the oxide aperture but not by the chemically transformed region (1290). On the other hand, the oxide aperture should not be too large, to keep the capacitance of the device low. Thus, the preferred diameter of the oxide confined aperture (1245) is the same as the diameter of the non-transformed core (1250) or slightly larger (up to 1 micrometer larger).

Figure 12B:
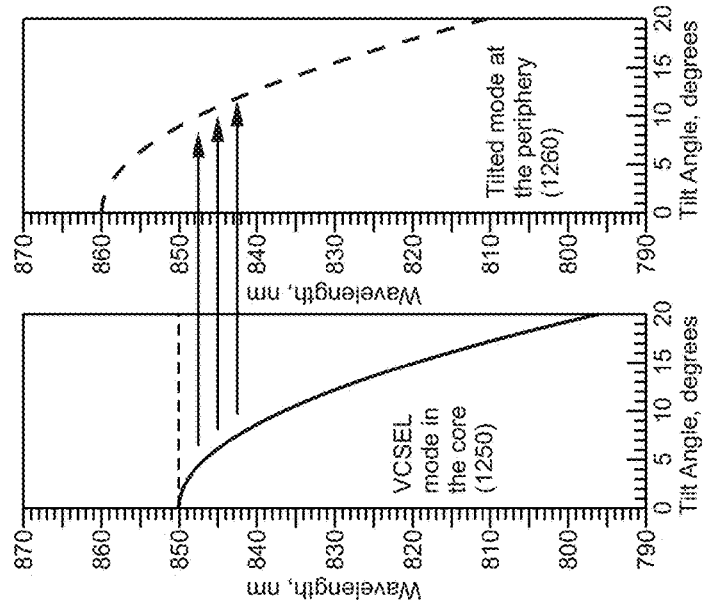
FIG. 12B shows schematically dispersion curves of a VCSEL optical mode of the core region and of a tilted optical mode of the periphery region of a planar multilayer structure mimicking the core and the periphery regions of the VCSEL of FIG. 12A. The transformation of the chemical profile in the periphery region enables leakage of the optical modes from the core to the periphery.
Figure 12A:
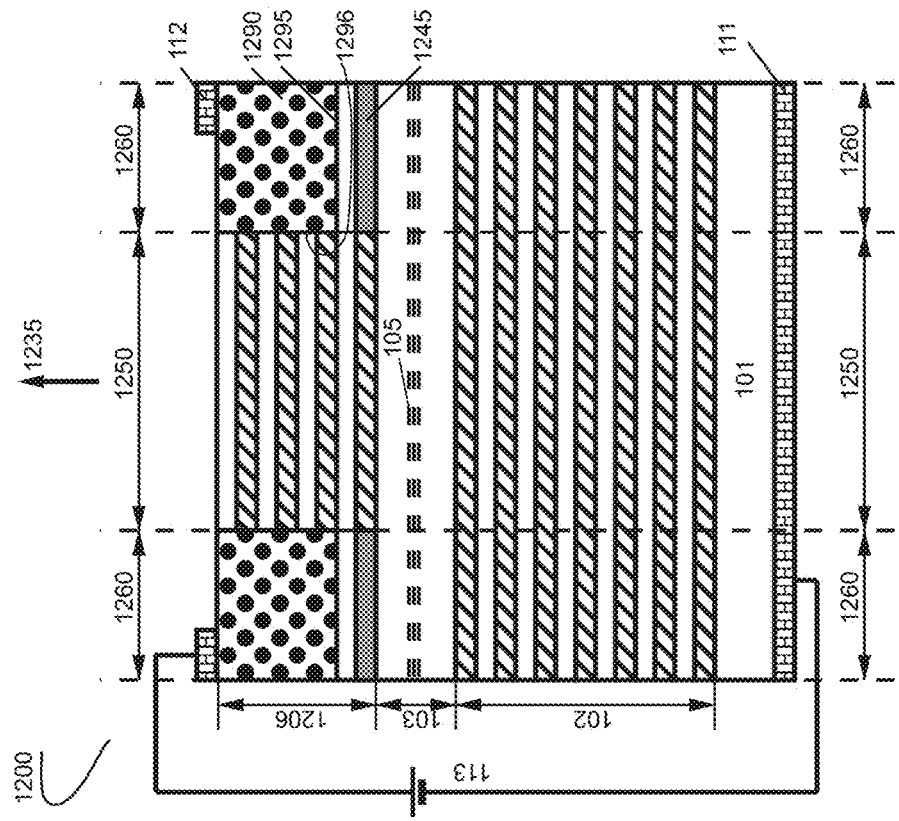
FIG. 12A shows schematically a cross-section of a vertical cavity surface emitting laser (VCSEL) subject to a transformation of the chemical profile in the periphery region, wherein additional oxide-confined aperture is introduced to determine the current path.

A change of the vertical refractive index profile at the periphery (1260) with respect to the vertical refractive index profile in the core (1250) enables leakage of the optical modes from the core (1250) to the periphery (1260) and thus promotes a single transverse mode lasing (1235) (FIG. 12B).

Figure 13B:
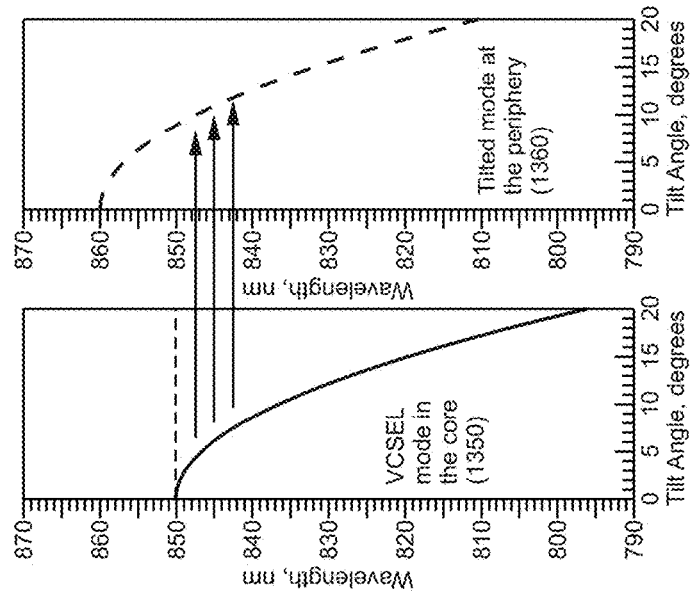
FIG. 13B shows schematically dispersion curves of a VCSEL optical mode of the core region and of a tilted optical mode of the periphery region of a planar multilayer structure mimicking the core and the periphery regions of the VCSEL of FIG. 13A. The transformation of the chemical profile in the periphery region enables leakage of the optical modes from the core to the periphery.
Figure 13A:
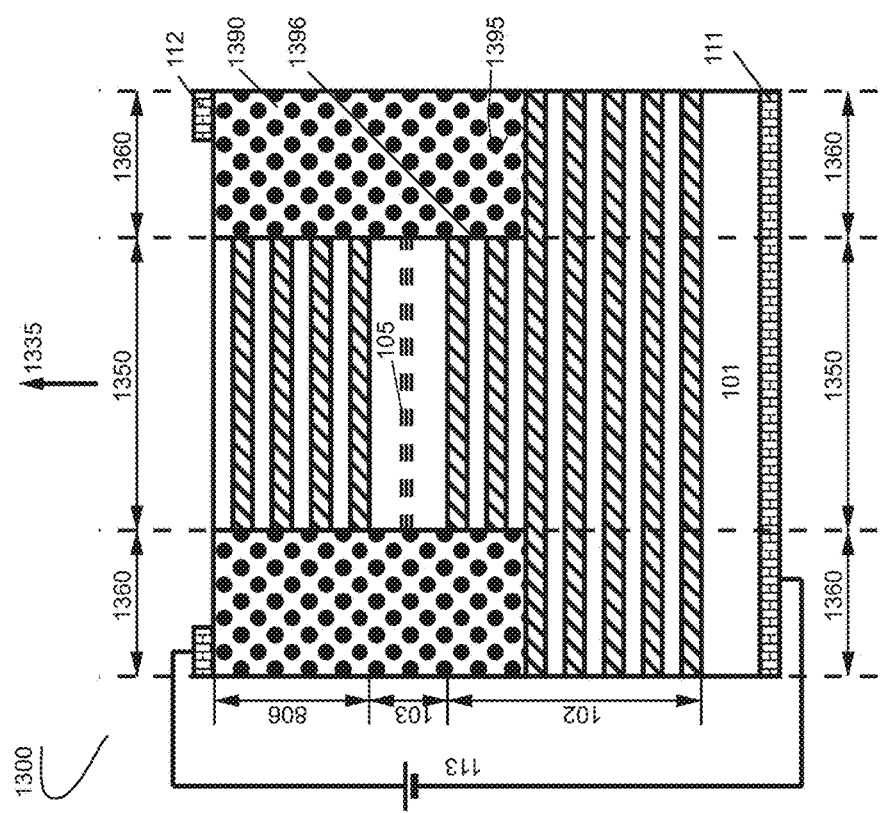
FIG. 13A shows schematically a cross-section of a vertical cavity surface emitting laser (VCSEL) subject to transformation of the chemical profile in the periphery region, wherein the transformation occurs through the active medium down to the bottom distributed Bragg reflector, according to yet another embodiment of the present invention.

FIG. 13A shows schematically a cross-section of a VCSEL (1300) according to yet another embodiment of the present invention. The chemically transformed region (1390) expands from the top surface of the device down through the top DBR (806), through the cavity (103) and ends within the bottom DBR (102). Once the top DBR (806) is p-doped, the bottom DBR (102) is n-doped, the intermixed region (1390) should be p-doped. This can be realized if the chemical transformation is activated by diffusion of a p-type impurity, e. g. Zinc. The boundaries (1395) and (1396) are the boundaries between the p-doped transformed region (1390) and n-doped bottom DBR (102) which implies a p-n junction at those boundaries. Thus the device (1300) contains two p-n junctions. A first p-n junction is formed between the n-doped bottom DBR (102) and the p-doped top DBR (806), wherein the active medium (105) is just located within the first p-n junction. And the second p-n junction is formed at the boundaries (1395) and (1396) between the n-doped bottom DBR (102) and the p-doped transformed region (1390).

FIG. 10 illustrates the operation of the device having two p-n junctions. The top panel of FIG. 10 shows the I-V curve of the first p-n junction wherein the junction opens at an opening voltage $V_0$. The value of the opening voltage is determined by the energy of photons emitted by the device as mentioned above, in Eq. (10). On the other hand, the opening voltage of the second p-n junction equals $$V_1 = E_g/|e|, \quad (11)$$

where $E_g$ is the energy band gap of the semiconductor material at the boundaries (1395) and (1396). As the passive semiconductor materials are selected such that they are transparent to the emitted light, $E_g > E_{photon}$, and $V_1 > V_0$. Thus, there exists an interval of bias voltages at which the first p-n junction is open, and the second p-n junction is still closed. Then the current flow occurs only in the core region (1350), and no current flows through the periphery region (1360). Hence, no light is generated beneath the top contact.

As the chemical transformation in the region (1390) results in a change of the vertical profile of the refractive index in the periphery region (1360) which is distinct from the vertical profile of the refractive index in the core (1350), the optical modes in the core and at the periphery are no longer orthogonal, which enables leakage of the optical modes from the core (1350) to the periphery (1360) as illustrated in FIG. 13B. This promotes single transverse mode lasing (1335).

To enable correct operation of the device in a broad interval of the bias voltages, one needs to render the opening voltage of the second p-n junction $V_1$ as high as possible. FIG. 14A shows schematically a cross section of a VCSEL (1400) according to a further embodiment of the present invention. A p-doped chemically transformed region (1490) is formed extending from the top surface of the device through the top p-doped DBR (806), through the cavity (103), down to the n-doped bottom DBR (102). Boundaries (1495) and (1496) of the intermixed region (1490) form a second p-n junction. A special barrier region (1485) is introduced within the bottom DBR (102) such that the boundary (1495) between the intermixed region (1490) and the bottom DBR (102) lies within the region (1485) and that the layers of the barrier region (1485) has an energy bandgap broader than that of the rest of the layers in the structure. It is preferred that at least one layer of the region (1485) has the energy band gap exceeding the energy band gap of the rest of the semiconductor materials by at least 0.1 eV.

As the chemical transformation in the region (1490) results in a change of the vertical profile of the refractive index in the periphery region (1460) which is distinct from the vertical profile of the refractive index in the core (1450), the optical modes in the core and at the periphery are no longer orthogonal, which enables leakage of the optical modes from the core (1450) to the periphery (1460) as illustrated in FIG. 13B. This promotes single transverse mode lasing (1435).

Figure 15:
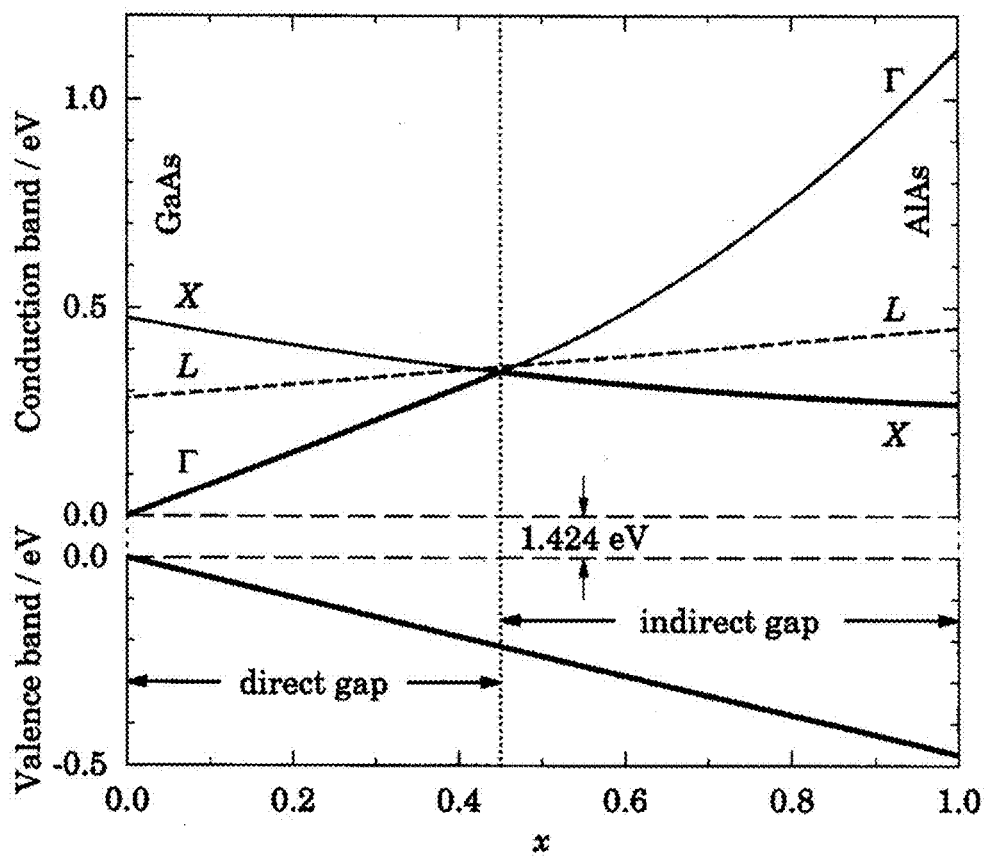
FIG. 15 shows the energy band diagram of the $Ga_{1-x}Al_xAs$ alloys showing the maximum energy band gap at the aluminum composition close to x=0.45 corresponding to the cross-over point between direct Γ-minimum and indirect X-minimum of the conduction band.

FIG. 15 shows an energy band diagram of the semiconductor alloys $Ga_{1-x}Al_xAs$. A one skilled in the art will appreciate that, once a DBR is formed of alternating layers of $Ga_{1-x}Al_xAs$, typically an alloy $Ga_{1-x}Al_xAs$ with the Aluminum molar fraction below 20% is chosen as high index material of the DBR. This can be, for example, $Ga_{1-x}Al_xAs$ with Aluminum composition 15%. If the device is configured to emit light at a wavelength longer than 870 nm, at which GaAs is transparent, then GaAs can be used as a high index material of the DBR. As the band gap energy of the $Ga_{1-x}Al_xAs$ alloy increases rapidly once the Aluminum composition increases from 0 to the cross-over point from the direct to indirect gap at x=45% and changes only slowly afterwards, the most important is to properly choose a high index material for the barrier region (1485) in FIG. 14A. To keep the functionality of the barrier region (1485) as a part of the DBR, i.e to keep certain refractive index step, on the one hand, and to increase the energy band gap of the material, on the other hand, it is preferred to choose, as a high index material, an alloy $Ga_{1-x}Al_xAs$ with Aluminum molar fraction exceeding thirty (30) percent.

Figure 21A:
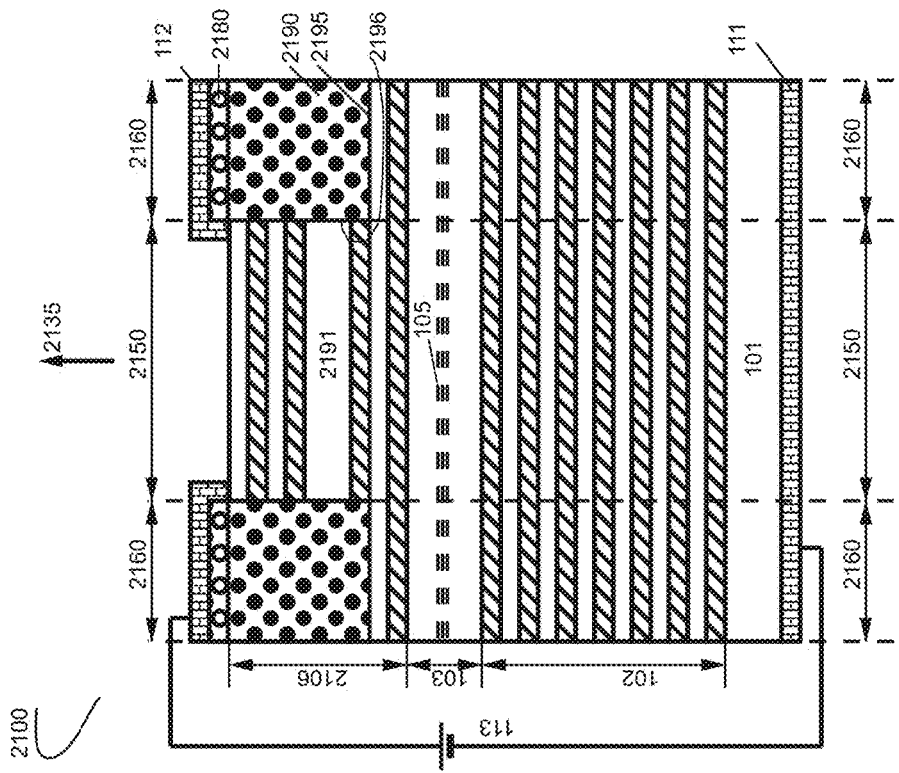
FIG. 21A shows schematically a cross-section of a duo-cavity vertical cavity surface emitting laser (VCSEL) subject to transformation of the chemical profile in the periphery region, wherein the transformation is the alloy compositional intermixing and it occurs through the active medium down to the bottom distributed Bragg reflector, according to yet another embodiment of the present invention.

FIGS. 21A through 23D disclose another embodiment of the present invention. FIG. 21A shows schematically a cross-section of a duo cavity VCSEL (2100). A second cavity (2191) is placed within the top DBR (2106). The chemical transformation of the region (2190) is alloy compositional intermixing. The intermixed region (2190) is created such that the bottom boundary (2195) is placed above the active cavity (103) but below the second cavity (2191). The intermixed region (2190) is n-doped, and as no bias is applied to the p-n junction at the boundaries (2195) and (2196) of the intermixing region (2190), this junction is closed and no electric current flows through the intermixed region (2190). The n-doped intermixing region (2190) is covered by a dielectric layer (2180) which separates it from the p-contact (112).

Figure 22A:
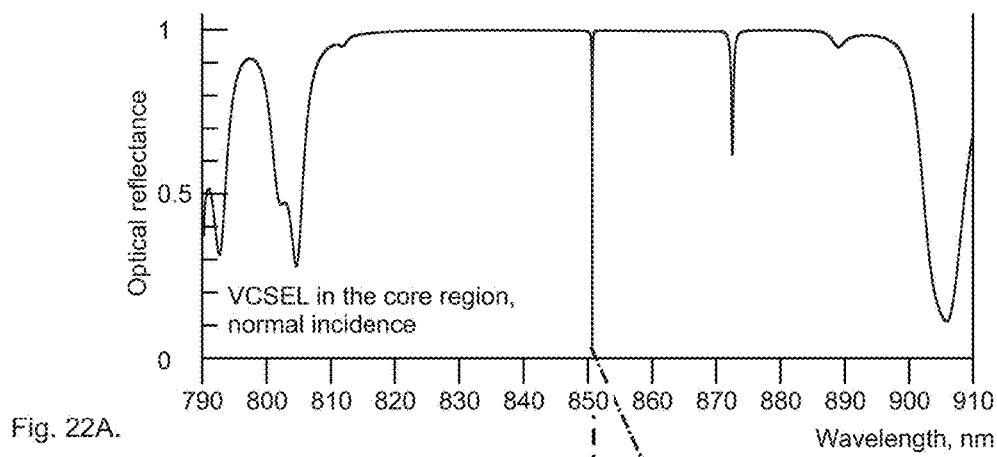
FIG. 22A shows the optical power reflectance spectrum at normal incidence of the vertical cavity surface emitting laser (VCSEL) structure of FIG. 21A in the core region revealing a VCSEL dip at 850 nm.
Figure 22B:
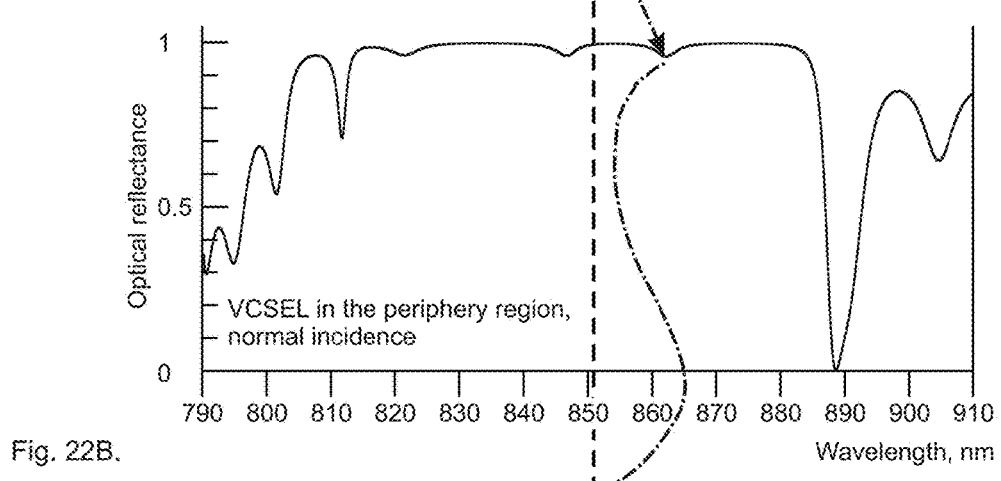
FIG. 22B shows the optical power reflectance spectrum at normal incidence of the VCSEL structure of FIG. 21A calculated for the periphery region upon alloy compositional intermixing. Vanishing of the second cavity due to compositional intermixing waves the resonant interaction between the active cavity and the second cavity and results in a long wavelength shift of the reflectivity dip of the active cavity.
Figure 22C:
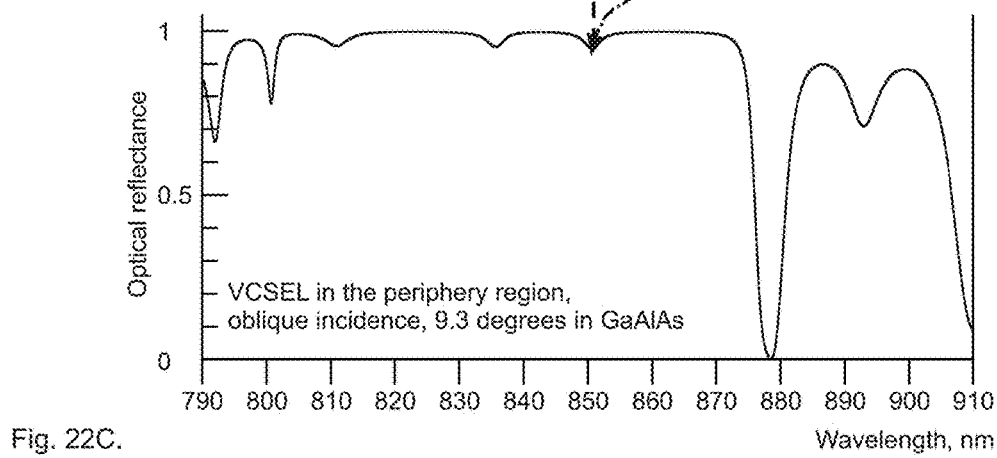
FIG. 22C shows the optical power reflectance spectrum of the VCSEL structure of FIG. 21A calculated for the periphery region for the oblique incidence of light at the angle 9.3 degrees, the angle being defined for a $Ga_{0.85}Al_{0.15}As$ layer.

FIGS. 22A through 22C show how the resonant interaction of two cavities manifests itself in the optical power reflectance spectra. Second cavity (2191) is configured such that its resonance wavelength is at a longer wavelength compared to the resonance of the active cavity. Additionally the resonance interaction between two cavities results in the repulsion of the two resonances from the spectral positions which they would have in the isolated cavities. Thus, FIG. 22A represents the optical power reflectance spectra of the VCSEL structure (2100) in the core region (2150) at normal incidence of light revealing two dips within the reflectivity stopband, one at 850 nm, and another one at 872 nm. In the periphery region the second cavity (2191) is compositionally intermixed with the neighboring DBR layers and disappears. Therefore, the repulsion of two resonances due to anticrossing vanishes, and the active cavity resonance shifts back to the spectral position of the isolated active cavity resonance, i.e. shifts towards a longer wavelength (863 nm in FIG. 22B) (a dash-dotted line connecting features in FIGS. 22A and 22B). Consequently, the optical power reflectance spectrum of the periphery calculated for an oblique incidence of light (at the angle 9.3° defined in the layer $Ga_{0.85}Al_{0.15}As$) reveals the dip matching the VCSEL dip at normal incidence in the core at 850 nm.

Figure 21B:
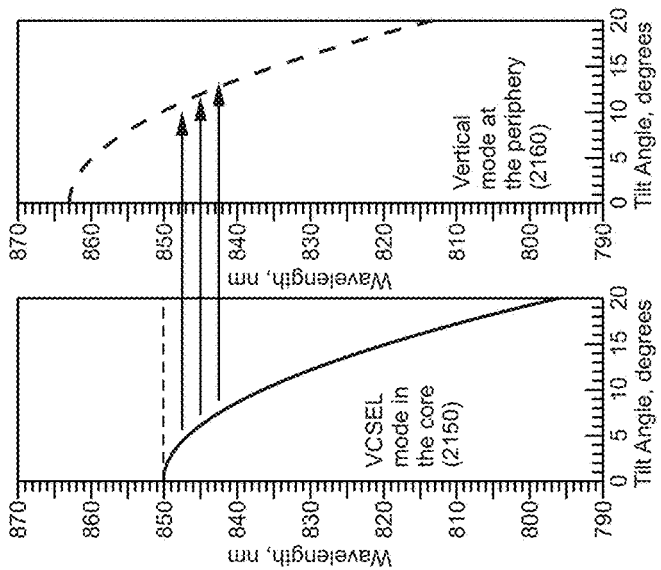
FIG. 21B shows schematically dispersion curves of a VCSEL optical mode of the core region and of the VCSEL optical mode of the periphery region of a planar multilayer structure mimicking the core and the periphery regions of the VCSEL of FIG. 21A. The alloy compositional intermixing in the periphery region results in a shift of the VCSEL optical mode towards longer wavelengths and enables leakage of the optical modes from the core to the periphery.

Correspondingly, FIG. 21B shows that the VCSEL mode of the core lies within the continuum spectrum associated with the vertical mode of the periphery, and that leakage of the VCSEL mode from the core (2150) to the periphery (2160) is allowed at all wavelengths. This leakage promotes single transverse mode lasing (2135) of the VCSEL (2100) of FIG. 21A.

FIGS. 23A through 23D compare the two optical modes of the VCSEL structure of FIG. 21A calculated for the same wavelength 850 nm. FIG. 23A shows the vertical refractive index profile in the core region (2150) of the device (2100) containing two coupled cavities. FIG. 23B shows the vertical electric field strength profile of the vertical optical mode of the core of the device. FIG. 23D shows the vertical refractive index profile in the periphery region (2160) of the device (2100) wherein the second cavity has vanished due to alloy compositional intermixing. The profile of FIG. 23D includes the intermixed region in which the complete alloy compositional intermixing has occurred forming a homogeneous alloy with a constant refractive index having some intermediate value between the low index and the high index of the DBR. FIG. 23C depicts the vertical electric strength profile of the vertical mode in the periphery region which has undergone intermixing.

It should be noted that the plot of FIG. 23C is inverted. The absolute values of the optical field strength that are the positive numbers are displayed in the downward vertical direction. This is done for convenience. In such a way it is more convenient to compare the nodes of the two optical field profiles. To make such a comparison, each node (or each local minimum) of the optical field profile of FIG. 23C is connected by a dashed line with the closest node of the optical field profile of FIG. 23B. One can notice that the optical field profiles of FIGS. 23B and 23C contain the same number of the nodes which results in a large overlap integral between the fields of FIGS. 11B and 11C (the overlap equals 85%, again two definitions of Eqs. (7) and (8) give very close values: $W_{ji}^{(1)}=85.3\%$, and $W_{ji}^{(2)}=84.8\%$).

Figure 24B:
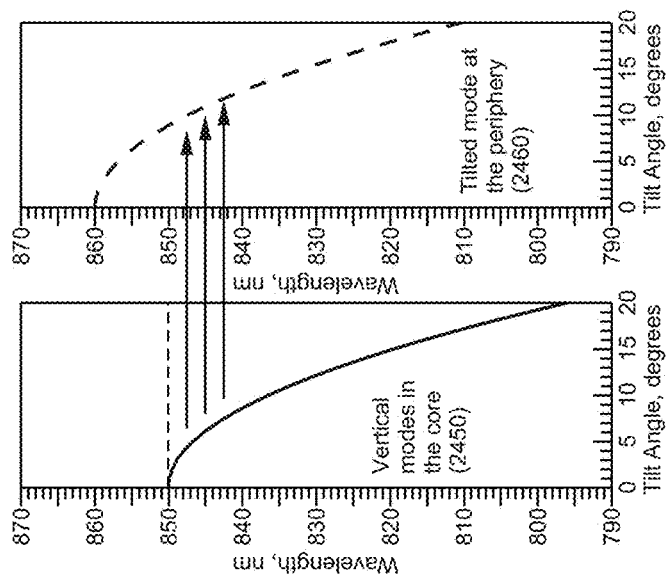
FIG. 24B shows schematically dispersion curves of the vertical optical mode in the core region and of a tilted optical mode of the periphery region of a planar multilayer structure mimicking the core and the periphery regions of the passive cavity surface emitting laser of FIG. 24A. The transformation of the chemical profile in the periphery region enables leakage of the optical modes from the core to the periphery.
Figure 24A:
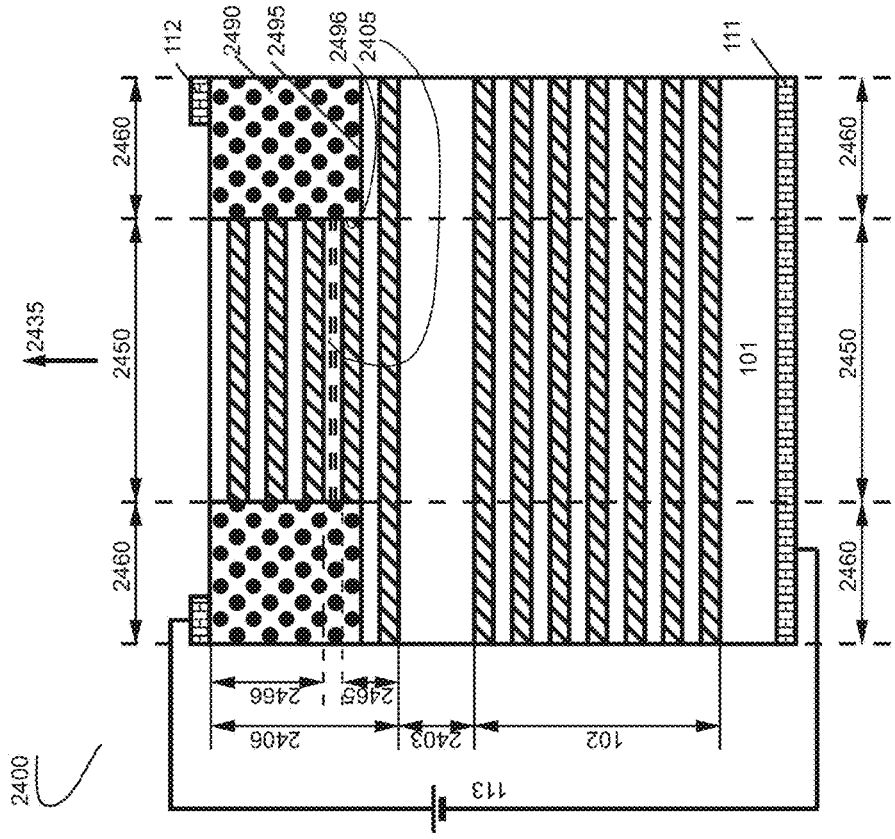
FIG. 24A shows schematically a cross-section of a passive cavity surface-emitting laser subject to transformation of the chemical profile in the periphery region, wherein the active medium is places in the top distributed Bragg reflector (DBR), and the resonant cavity is passive, and where the transformation is the alloy compositional intermixing and it occurs through the active medium down to the part of the top Bragg reflector, whereas the passive cavity is not subject to intermixing.

FIG. 24A shows schematically a cross-section of a passive cavity surface emitting laser (2400) according to yet another embodiment of the present invention. The concept of the passive cavity laser including passive cavity surface emitting laser was disclosed in the U.S. Pat. No. 8,472,496 "OPTOELECTRONIC DEVICE AND METHOD OF MAKING SAME", filed Jul. 6, 2010, issued Jun. 25, 2013, invented by one of the inventors of the present invention (Ledentsov), wherein the patent is incorporated herein by reference. In a passive cavity surface emitting laser the resonant cavity is passive, and the active medium is placed within one of the DBRs. Fabrication and characterization of a passive cavity surface-emitting laser was carried out in the publication (J. A. Lott, V. A. Shchukin, N. N. Ledentsov, A. M. Casten, and K. D. Choquette, "Passive cavity surface emitting laser", Electronic Letters, Volume 41, Issue 12, pages 717-718, 9 Jun. 2011, wherein this publication is hereby incorporated herein by reference.) Despite a reduction of the optical confinement factor of the lasing optical mode of the device with respect to the value in a conventional VCSEL by approximately a factor of 3, the passive cavity surface emitting laser has demonstrated stable lasing.

The passive cavity surface emitting laser (2400) comprises an n-doped bottom DBR (102), an n-doped passive cavity (2403), and a top DBR (2406), wherein the latter consist of an n-doped section part (2465), an undoped section further comprising an active medium (2405), and a p-doped section (2466). The region (2490) in which chemical transformation occurs expands from the top surface down through the p-doped section (2466) of the top DBR (2465), through the active medium (2405) and has a bottom boundary (2495) within the n-doped section (2465) of the top DBR (2406). The chemical transformation in the region (2490) is activated by diffusion of a p-type impurity, preferably of Zinc.

Similar to the device (1300), the passive cavity surface emitting laser (2400) has two p-n junctions. A first p-n junction is formed between the n-doped part (2465) of the top DBR (2406) and a p-doped part (2466) of the top DBR (2406), wherein the active medium (2405) is located within the first p-n junction. The second p-n junction is formed at the boundaries (2495) and (2496) between the p-doped chemically transformed region (2490) and the n-doped section (2465) of the top DBR (2406). It was shown above in the description of the embodiment of FIG. 13 that in a certain interval of the bias voltage, the first p-n junction is open whereas the second p-n junction is closed, and no current flow occurs through the chemically transformed region (2490), and no light is generated beneath the top contact.

As the chemical transformation results in a change of the vertical profile of the refractive index in the periphery region (2460) which is distinct from the vertical profile of the refractive index in the core (2450), the optical modes in the core and at the periphery are no longer orthogonal, which enables leakage of the optical modes from the core (2450) to the periphery (2460) as illustrated in FIG. 24B and thus promotes single mode lasing (2435).

FIG. 25A shows schematically a duo cavity passive cavity surface emitting laser (2500) according to a further embodiment of the present invention. The device (2500) combines the properties of the two embodiments, the one of FIG. 21A and the one of FIG. 24A. The selective chemical transformation carried out in the region (2590) is controlled in such a way that the process is an alloy compositional intermixing activated by the diffusion of a p-type impurity, preferably of Zinc. The device (2500) as compared to the passive cavity surface-emitting laser (2400) contains, in the p-doped part (2566) of the top DBR (2506) also a second cavity (2591).

The second cavity (2591) is present only in the core part (2550) of the device, whereas it has disappeared at the periphery (2560) due to alloy compositional intermixing. The duo cavity approach, as described for the embodiment of FIGS. 21A-23D, enables a strong leakage of the vertical modes of the core to the vertical modes of the periphery (as also shown in FIG. 25B), whereas the overlap integral of both modes is large. A further advantage of the passive cavity surface emitting laser (2500) versus VCSEL (2100) is a possibility to apply a p-type impurity, e.g. Zinc to activate alloy compositional intermixing.

In another group of embodiments of the present invention the structure of the device in the core region is configured such that not a vertical mode, but a tilted mode propagating at a certain non-zero angle with respect to the direction normal to the layers of the structure is the designated mode that should lase. Also for such a device, which is known as tilted cavity laser, the present invention can be applied to enhance the leakage losses of the undesired lateral modes, the leakage occurring to the periphery region of the structure. A one skilled in the art will appreciate that such a tilted cavity laser contains multilayer interference reflectors that are configured to promote reflection and feedback for the tilted optical mode propagating at a certain angle or in certain interval of angles. A distributed Bragg reflector is thus a particular realization of a multilayer interference reflector configured for the normal propagation of light.

Figure 16:
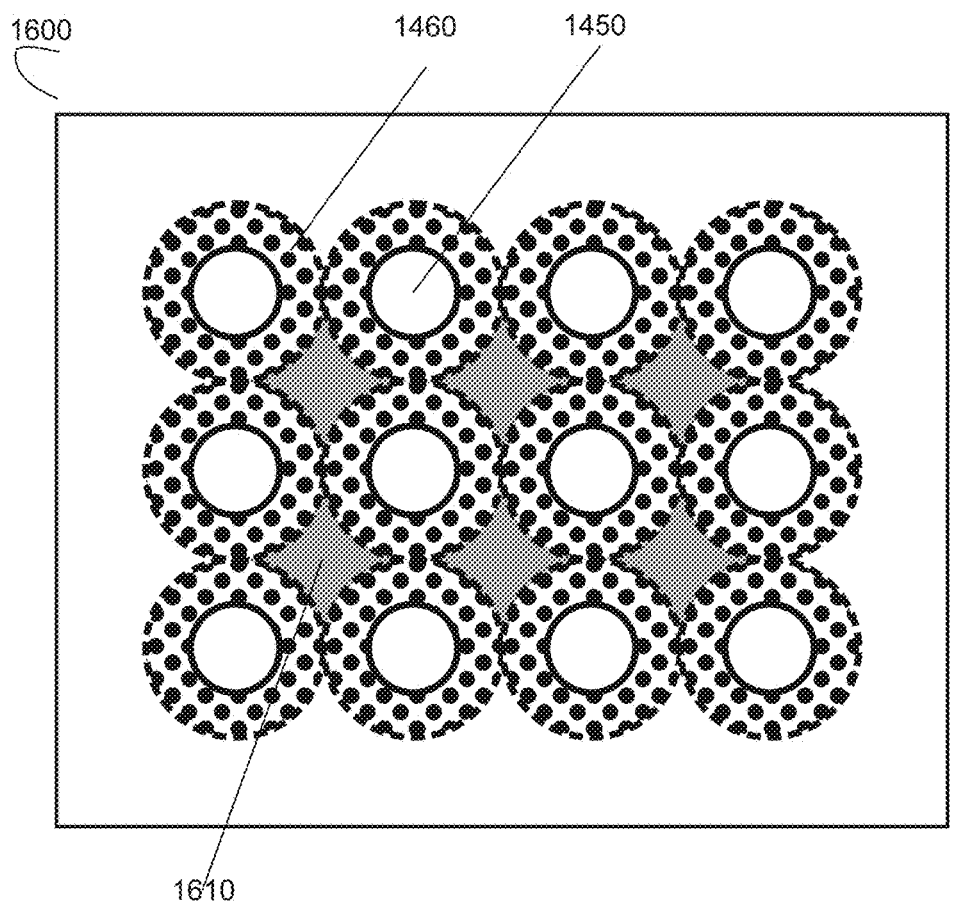
FIG. 16 shows schematically a plan view of phase-coupled array of vertical cavity surface emitting lasers (VCSELs), wherein the coupling is realized via the leakage of the optical modes from the core regions into the surrounding periphery regions, according to another embodiment of the present invention.

FIG. 16 shows schematically a plan view of an array (1600) of phase-coupled VCSELs, according to yet another embodiment of the present invention. An array of holes (1450) is formed on the surface. The selective chemical transformation process is carried out. As a result of the process chemically transformed regions (1460) are formed around the holes. The width of the chemically transformed regions is preferably selected such that the chemically transformed regions formed around neighboring holes overlap or are close to overlap. The areas (1610) between the intermixed regions are the areas, in which the current flow through the active medium is possible and in which no chemical transformation occurs. The contact is deposited onto these areas (1610). The epitaxial structure is configured according to the present invention (FIGS. 8A, 12A, 13A, 14A, 21A, 24A, 25A). The optical modes excited beneath the contacts leak into the chemically transformed regions. Due to a sufficiently strong optical coupling between neighboring chemically transformed regions, a single coherent mode can be formed extending over the entire array of VCSELs. In a further embodiment of the present invention, a single coherent mode extends across the entire wafer.

Figure 17A:
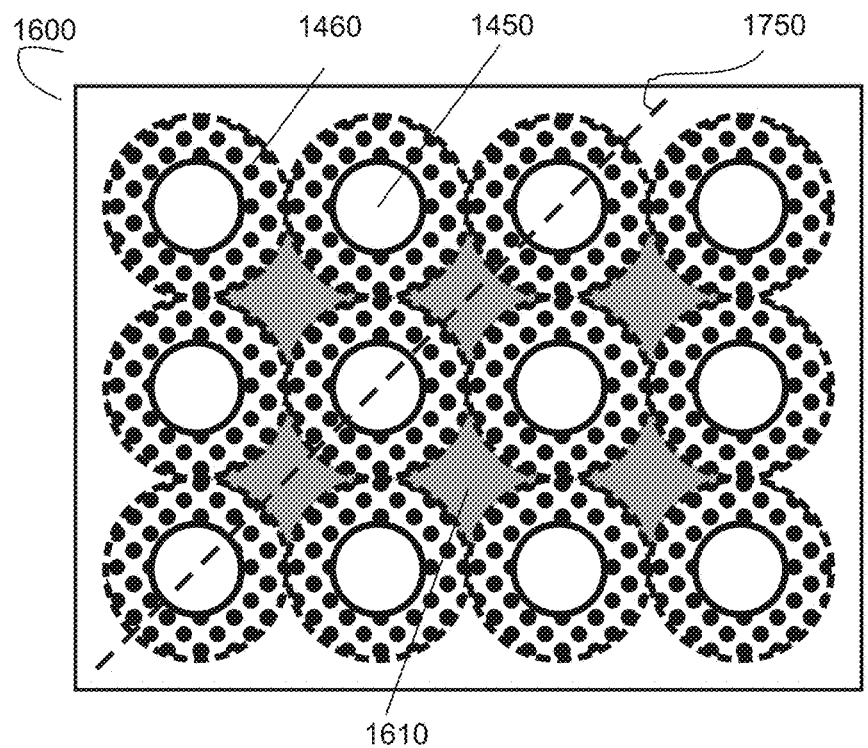
FIG. 17A shows schematically a plan view of phase-coupled array of vertical cavity surface emitting lasers (VCSELs), wherein the coupling is realized via the leakage of the optical modes from the core regions into the surrounding periphery regions, similar to FIG. 16, and further denotes a plane for the vertical cross-section to be shown in FIG. 17B.
Figure 17B:
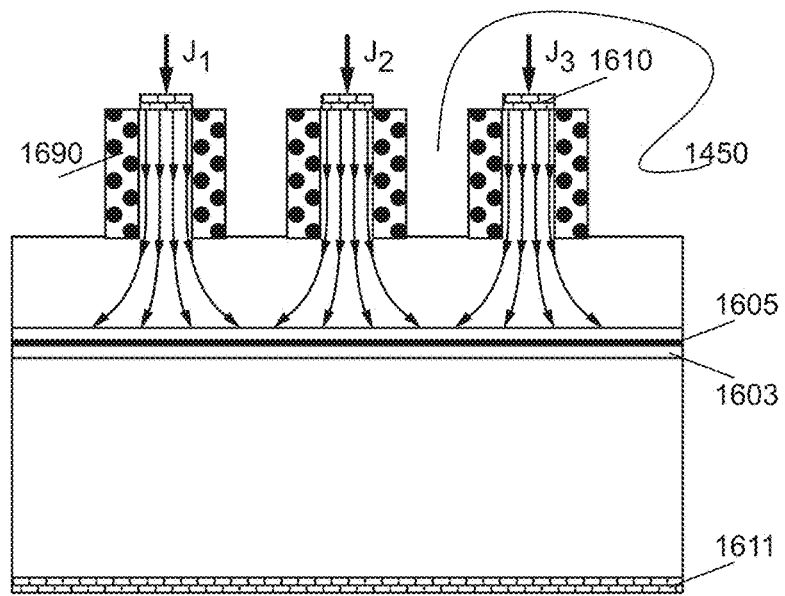
FIG. 17B shows schematically a vertical cross-section of a phase-coupled array of vertical cavity surface emitting lasers of FIGS. 16 and 17A, wherein such array is employed for the steering of the laser beam.

FIGS. 17A and 17B shows schematically an array of phase coupled VCSELs, which is used for beam steering. FIG. 17A repeats FIG. 16, and contains additionally a line (1750) which defines a vertical plane.

FIG. 17B shows schematically a cross-section of the array of phase-coupled VCSELs (1600) in the vertical plane defined by the line (1750). The top contact (1612) is deposited on the top surface of the array, except the holes (1450). The contact area (1610) is depicted in FIG. 17B as three parts that are not electrically connected. Through each part, an independent current ($J_1$, $J_2$, or $J_3$) flows. The paths of the current through neighboring sections (1620) is separated by the chemically transformed regions (1690). The current spreads and reaches the active cavity (1603), in which the active medium (1605) is placed. The bottom contact (1611) is preferably formed as a single contact for the whole array. The array of VCSELs (1600) is capable to emit a phase coupled laser light. The individually controllable currents ($J_1$, $J_2$, or $J_3$) control the phase of the phase-coupled optical field of the laser light, and, hence, the direction, the vertical or tilted at a controlled angle, of the emitted coherent laser beam.

A one skilled in the art will appreciate, that, similar to an array of circular holes (1450), and array of elongated holes can be formed. This array can be configured such that it fixes polarization of a polarized laser light emitted by the array.

A one skilled in the art will further appreciate that an array similar to that of FIGS. 16 and 17 can be configured such that each pumped area of the array does not generate laser light but operates as a light-emitting diode or a gain chip. Then, once put into an external cavity, the array will generate laser light, similar to a Vertical-External-Cavity Surface-Emitting Laser (VECSEL).

Embodiments of the FIGS. 18A through 20 describe the same approach disclosed in the present application for a duo cavity VCSEL (FIG. 21A) or duo cavity passive cavity surface emitting laser (FIG. 25A) but employed for edge-emitting lasers.

Figure 18A:
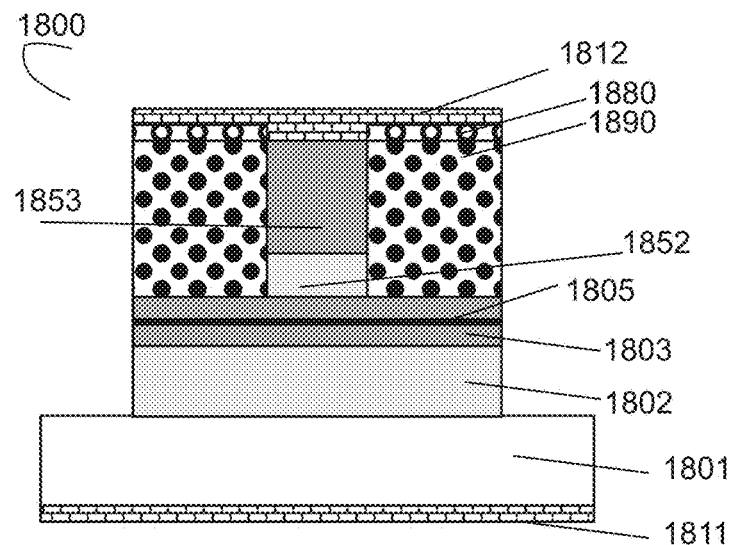
FIG. 18A shows schematically a cross-sectional view of a striped edge-emitting laser, in which areas adjacent to the stripe are subject to chemical transformation realized as alloy compositional intermixing, according to yet another embodiment of the present invention.

FIG. 18A shows schematically a cross-section of an edge-emitting laser (1800) according to an embodiment of the present invention. The laser contains two coupled cavities, or, the same, two coupled waveguides, namely the active waveguide (1803) and the passive waveguide (1853), separated by a top cladding layer (1852) which is an evanescent reflector. The active cavity, or the active waveguide (1803) contains the active medium (1805). The active waveguide (1803) is bounded from the bottom by a bottom cladding (1802) which is an evanescent reflector. The structure is grown epitaxially on a substrate (1801). Selective diffusion of impurities followed that activates alloy compositional intermixing results in the formation of the intermixed regions (1890). In the embodiment of FIG. 18A, an n-type impurity, e.g. Silicon is used for the alloy compositional intermixing process. An n-contact (1811) is mounted on substrate (1801). A dielectric layer (1880) is deposited on top of the intermixed region (1890) to isolate electrically the n-doped region from the p-contact (1812).

Figure 18B:
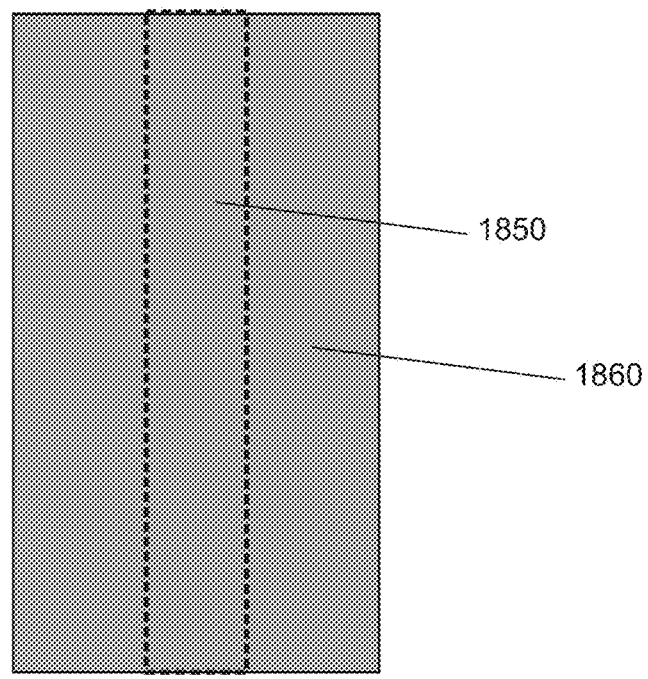
FIG. 18B shows schematically a top view of the edge-emitting laser of FIG. 18A.

FIG. 18B shows schematically a planar cross-section of the edge-emitting laser of FIG. 18A showing the core region (1850) and the periphery region (1860).

Figures 1A, 1B:
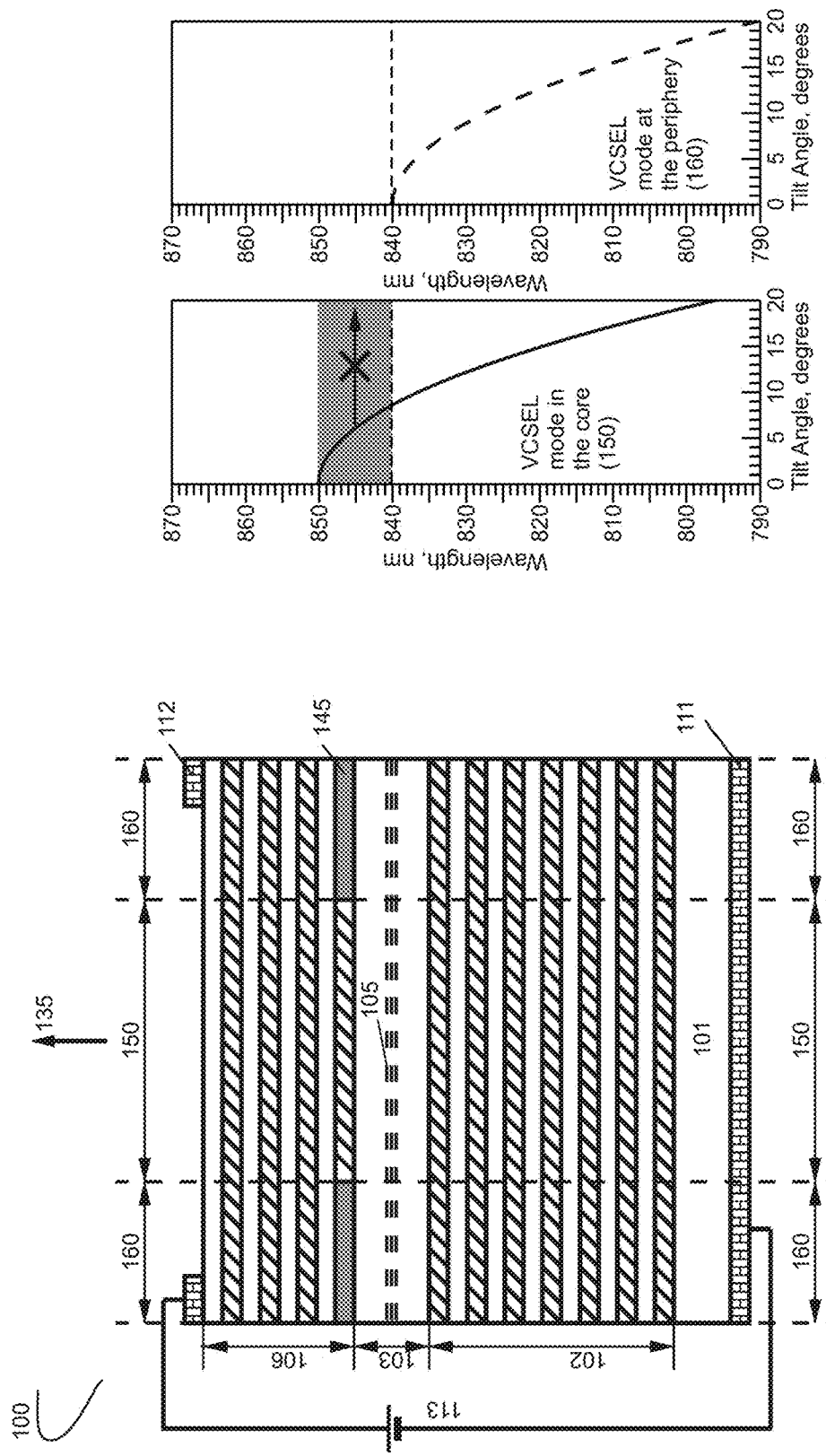
FIG. 1A. Schematic cross-section of a prior art vertical cavity surface-emitting laser (VCSEL) with an oxide-confined aperture.
FIG. 1B. Schematic dispersion curves of the optical modes in the planar multilayer structure mimicking the VCSEL of FIG. 1A revealing a spectral interval in which VCSEL modes cannot leak from the core to the periphery.
Figures 2A, 2B:
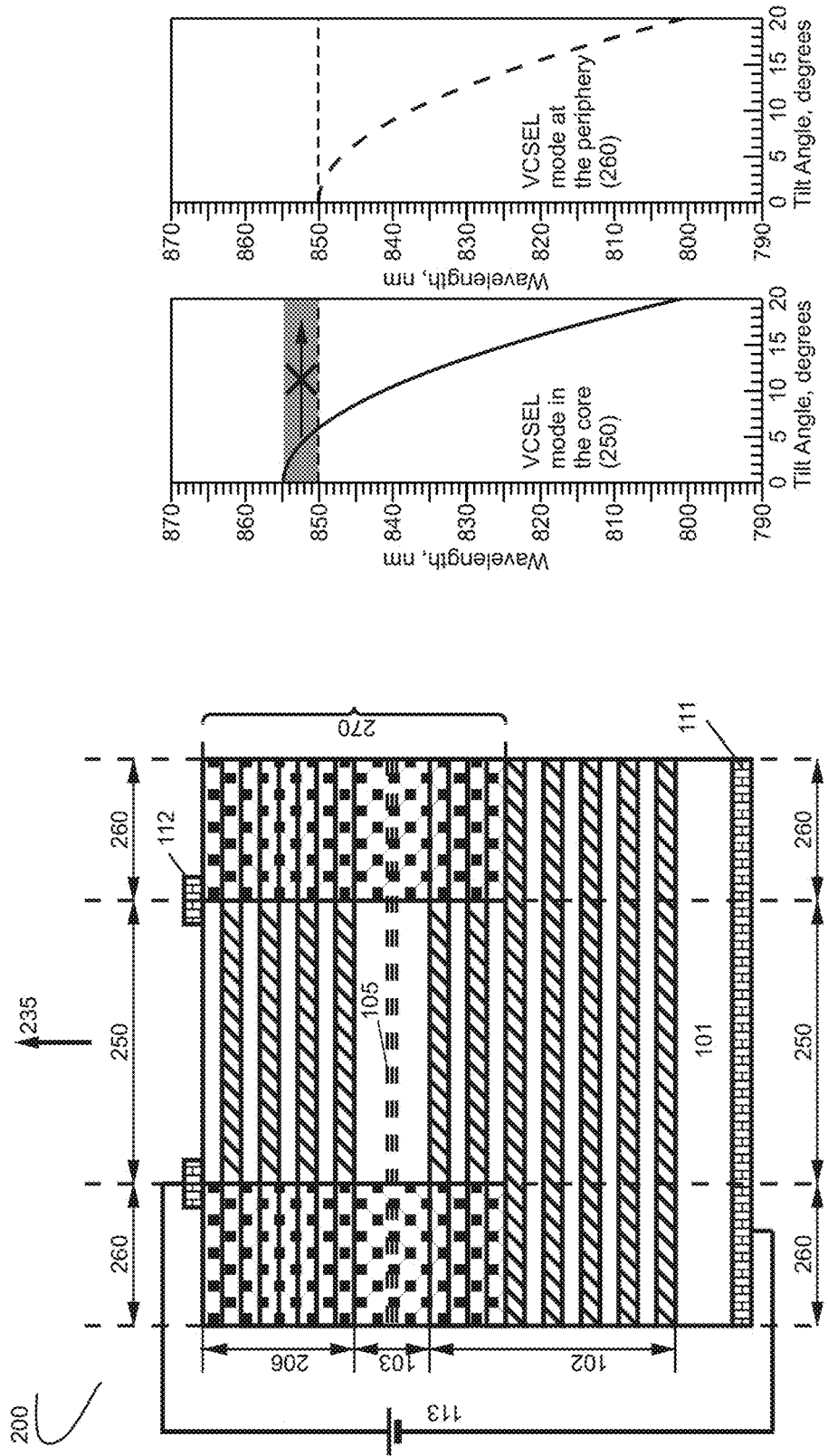
FIG. 2A. Schematic cross-section of a prior art vertical cavity surface emitting laser (VCSEL) wherein the current flow is controlled by proton bombardment, wherein proton bombardment determines the core and the periphery of the structure.
FIG. 2B. Schematic dispersion curves of the VCSEL optical modes in planar multilayer structures mimicking the VCSEL of FIG. 2A showing a spectral range of the modes which cannot leak from the core to the periphery.
Figure 3B:
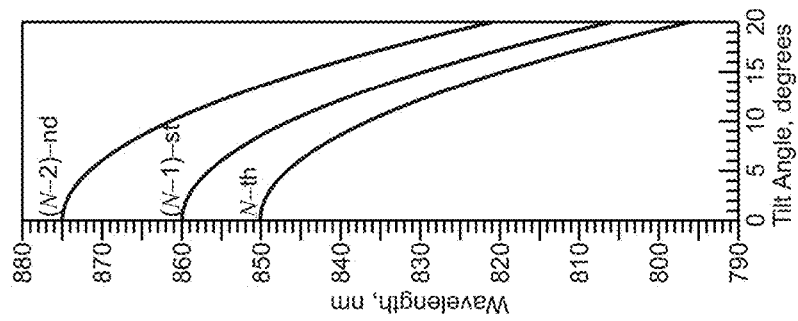
FIG. 3B. Schematic dispersion curves of several optical modes of the multilayer structure of FIG. 3A.
Figure 3A:
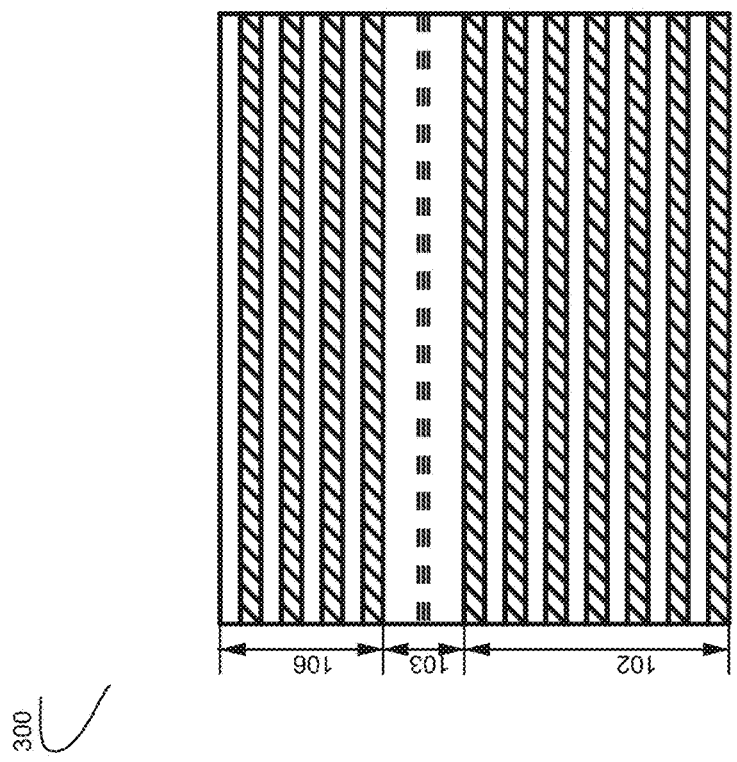
FIG. 3A. Schematic cross-section of a planar multilayer structure mimicking a vertical cavity surface emitting laser.
Figure 4B:
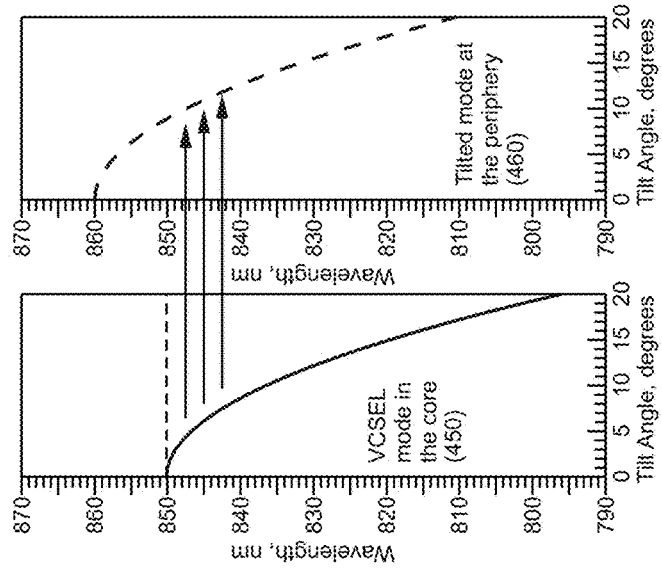
FIG. 4B. Schematic dispersion curves of the VCSEL optical mode in the core and of a tilted optical mode of the periphery of the planar multilayer structure mimicking the core and the periphery of the VCSEL of FIG. 4A, respectively. Leakage of the optical modes from the core to the periphery is possible.
Figure 4A:
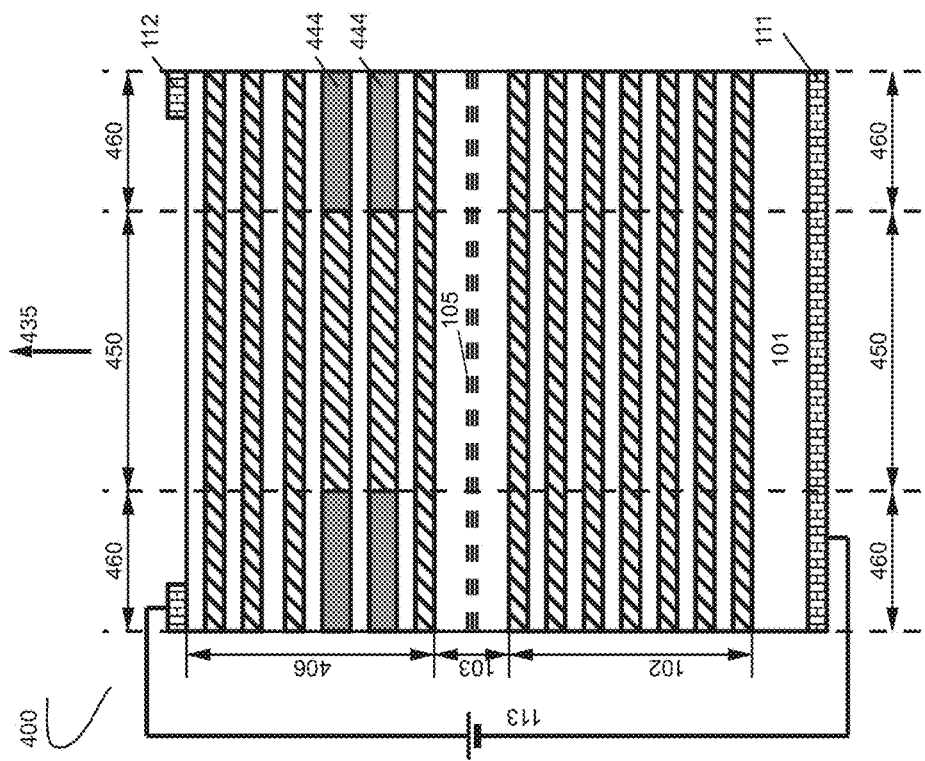
FIG. 4A. Schematic cross-section of a vertical cavity surface emitting laser (VCSEL) with engineered oxide apertures promoting lateral leakage of the optical modes from the core to the periphery.
Figure 5A:
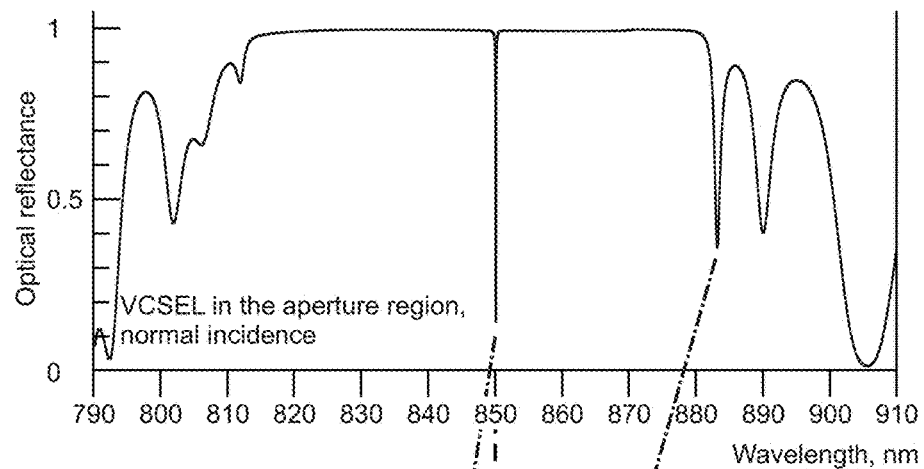
FIG. 5A shows the optical power reflectance spectrum at normal incidence of the vertical cavity surface emitting laser (VCSEL) structure of FIG. 4A in the core region revealing a VCSEL dip at 850 nm.
Figure 5B:
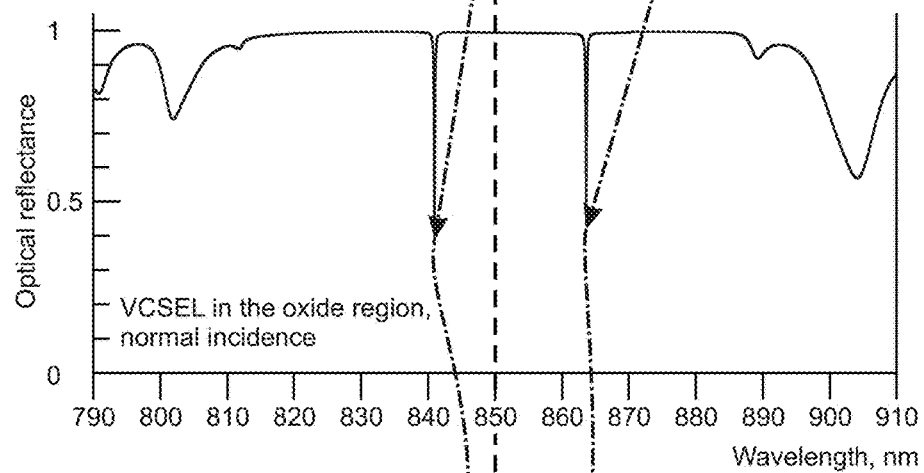
FIG. 5B shows the optical power reflectance spectrum at normal incidence of the VCSEL structure of FIG. 4A calculated for the oxidized periphery region.
Figure 5C:
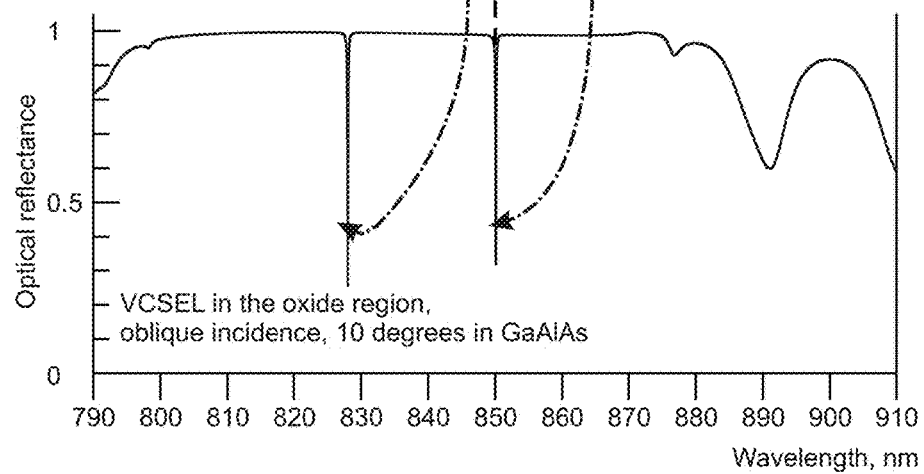
FIG. 5C shows the optical power reflectance spectrum of the VCSEL structure of FIG. 4A calculated for the oxidized periphery region for the oblique incidence of light at the angle 10 degrees, the angle being defined for a $Ga_{0.85}Al_{0.15}As$ layer.
Figure 7B:
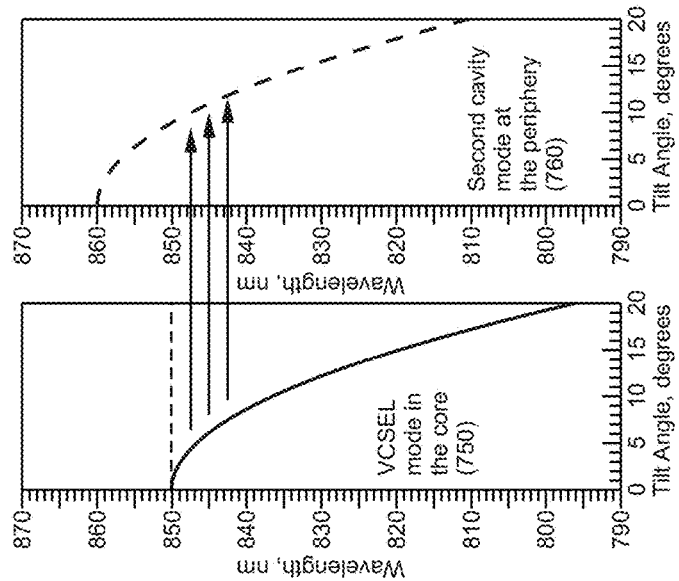
FIG. 7B shows schematically dispersion curves of the VCSEL mode in the core region of the VCSEL of FIG. 7A and one of the tilted modes, namely, of the second cavity mode of the periphery region of a planar multilayer structures, mimicking the core and the periphery regions of the VCSEL of FIG. 7A. VCSEL modes can leak from the core to the periphery.
Figure 7A:
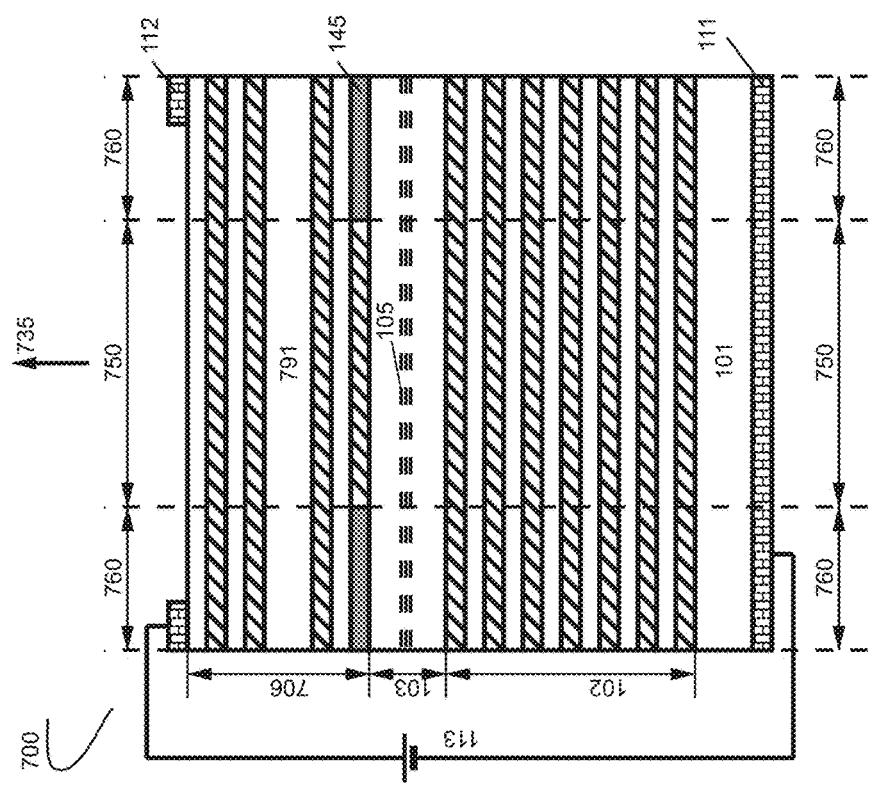
FIG. 7A. Schematic cross-section of a vertical cavity surface emitting laser (VCSEL) with coupled cavity.
Figure 19A:
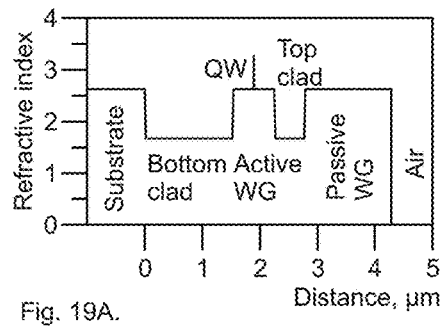
FIGS. 19A through 19G illustrate the operational principle of the edge-emitting laser of FIGS. 18A and 18B.
Figure 19E:
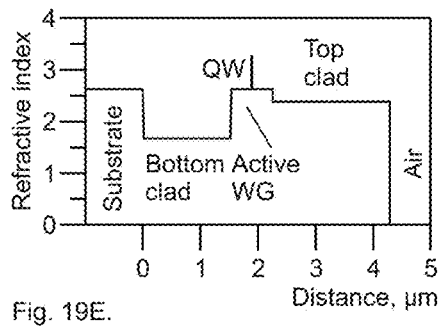
Figure 19B:
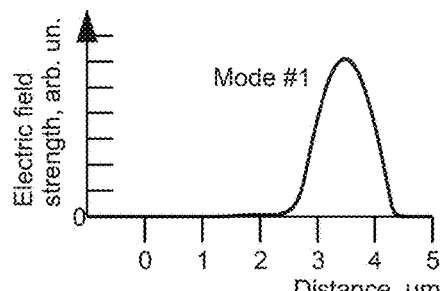
Figure 19F:
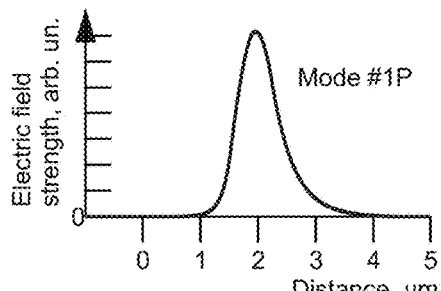
Figure 19C:
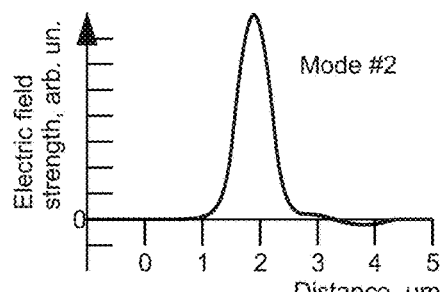
Figure 19D:
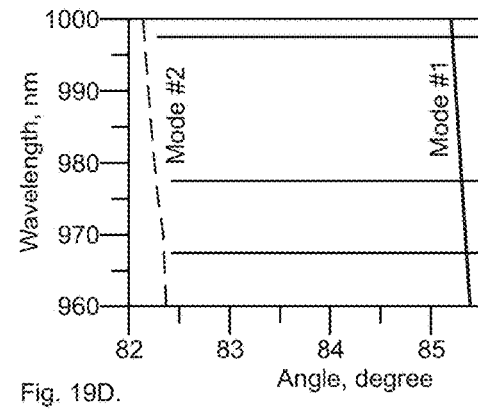

FIGS. 19A through 19G illustrate the operation of the edge-emitting laser (1800) configured, for definiteness, to emit laser light at the wavelength 980 nm. FIG. 19A displays the vertical refractive index profile of the laser (1800). The profile contains two coupled waveguides, namely the active waveguide further containing the active medium, and the passive waveguide. The both waveguides are configured such that the fundamental vertical mode denoted in FIG. 19B as Mode #1 is localized mainly in the passive waveguide, and the next order vertical mode denoted Mode #2 is localized mainly in the active waveguide (FIG. 19C). Mode #2 having the maximum optical confinement factor in the active medium is the mode in which laser light is generated. FIG. 19D shows dispersion curves of the Mode #1 and Mode #2. The dispersion curves are plotted in the same variables "angle"-"wavelength" and the dispersion curves (FIG. 3B) of the planar multilayer structure mimicking VCSEL (FIG. 3A). A one skilled in the art will appreciate that, in variables "angle"-"wavelength", once the angle is fixed, the curve corresponding to a mode with a smaller mode number is positioned at a longer wavelength. Further, once the wavelength is fixed, the dispersion curve for the mode having a lower mode number is positioned at larger angles. Both the dispersion curves for a VCSEL-type structure (FIG. 3B) and for an edge-emitting structure obey thus rule.

FIG. 19E shows the vertical profile of the refractive index upon alloy compositional intermixing. It is assumed that the intermixing has occurred in the top cladding layer and in the passive waveguide. Once the passive waveguide has disappeared, the mode that was localized in the passive waveguide has vanished. The fundamental vertical mode at the periphery of the structure is now localized in the active waveguide (Mode #1P in FIG. 19F).

Figure 19G:
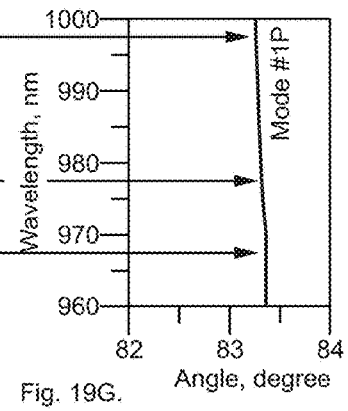

FIG. 19G shows the dispersion curve of Mode #1P in the periphery region of the structure.

A one skilled in the art will appreciate that, in the core of the structure, the resonant interaction of Mode #1 and Mode #2 results in a repulsion, whereas, for a given wavelength, Mode #1 shifts towards larger angles and Mode #2 shifts towards smaller angles. Once, at the periphery, one of the two modes vanishes, the remaining Mode #1P at the periphery, for a given wavelength, has an effective angle, intermediate between the values of the angles for the modes #1 and #2 in the core. Therefore, with respect to the lasing Mode #2 of the core, Mode #1' of the periphery has a dispersion curve positioned at larger angles. Thus, the lasing mode is allowed to leak in the transverse lateral direction to the periphery, into the Mode #1P. This leakage promotes single transverse mode lasing of an edge-emitted laser (1800).

In a further embodiment of the present invention the same approach is applied to a tilted wave laser disclosed in the U.S. Pat. No. 7,421,001 "EXTERNAL CAVITY OPTOELECTRONIC DEVICE", filed Jun. 16, 2006, issued Sep. 2, 2008, and U.S. Pat. No. 7,583,712 "OPTOELECTRONIC DEVICE AND METHOD OF MAKING SAME", filed Jan. 3, 2007, issued Sep. 1, 2009, both by two of the three inventors of the present invention (Ledentsov and Shchukin), wherein these patents are hereby incorporated herein by reference. The approach disclosed in the present patent application enables fabrication of single transverse mode titled wave lasers.

In another embodiment of the present invention the approach disclosed in the present patent application is applied to a semiconductor disc laser.

In yet another embodiment of the present invention the approach disclosed in the present patent application can be applied to a single photon emitter.

In a further embodiment of the present invention the approach disclosed in the present patent application is applied to an emitter of entangled photons.

In another embodiment of the present invention the approach disclosed in the present patent application is applied to a light-emitting diode.

Figure 20:
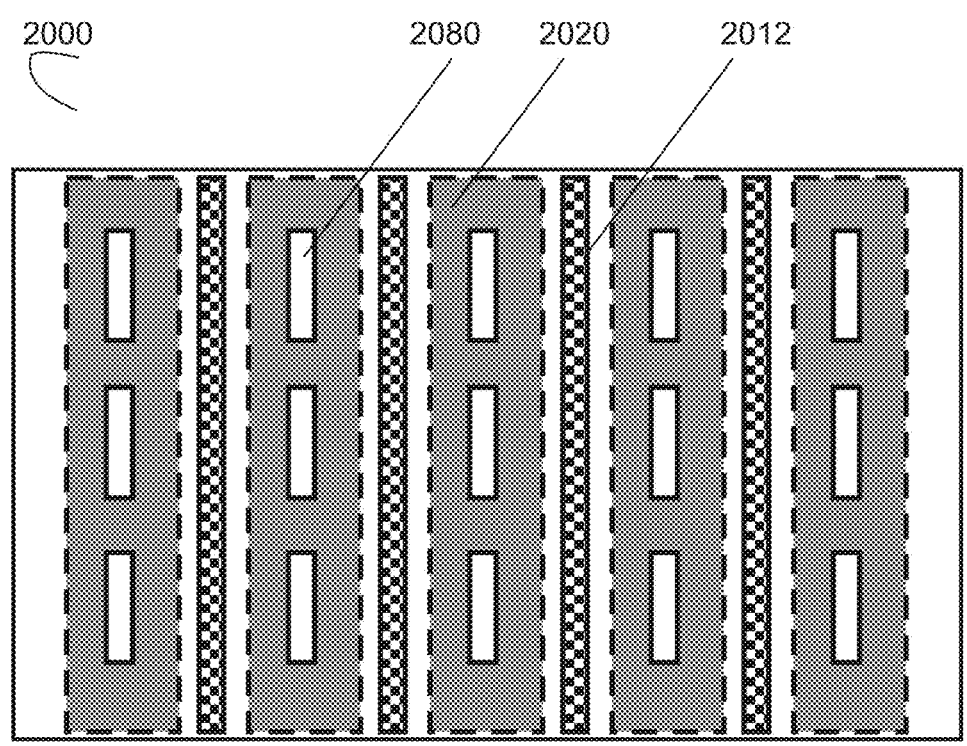
FIG. 20 shows schematically a plan view of a phase-coupled array of edge-emitting lasers, wherein the coupling is realized via the leakage of the optical modes from the core regions in the surrounding periphery regions, according to a further embodiment of the present invention.

FIG. 20 shows schematically a plan view of a coherently coupled array (2000) of edge-emitters, according to another embodiment of the present invention. An array of holes (2080) is formed on the surface. The alloy compositional intermixing process is carried out. As a result of the process, the regions (2020) in which alloy compositional intermixing has occurred are formed around the holes. The width of the intermixed areas is preferably selected such that the intermixed regions formed around neighboring holes overlap forming extended intermixed areas shown approximately as grey rectangles. Current is injected through the contacts (2012). The epitaxial structure is designed according to the present invention (FIGS. 18A through 19G). The optical modes excited beneath the contacts leak into the intermixed regions. Due to a sufficiently strong coupling between neighboring intermixed regions, a single coherent mode can be formed across the array of edge-emitting lasers. In a further embodiment of the present invention, a single coherent mode extends across the entire wafer.

Although the consideration and modeling of example embodiments has been carried out for TE-optical modes, a one skilled in the art will appreciate that a similar consideration can be done for devices operating in TM-optical modes. Therefore, all disclosed features can be formulated in a general way for optical modes of any kind.

All publications, patents and patent applications mentioned in this specification are herein incorporated in their entirety by reference into the specification, to the same extent as if each individual publication, patent or patent application was specifically and individually indicated to be incorporated herein by reference. In addition, citation or identification of any reference in this application shall not be construed as an admission that such reference is available as prior art to the present invention.

Although the invention has been illustrated and described with respect to exemplary embodiments thereof, it should be understood by those skilled in the art that the foregoing and various other changes, omissions and additions may be made therein and thereto, without departing from the spirit and scope of the present invention. Therefore, the present invention should not be understood as limited to the specific embodiments set out above but to include all possible embodiments which can be embodied within a scope encompassed and equivalents thereof with respect to the feature set out in the appended claims.

What is claimed is:

1. An optoelectronic device comprising:
a) a multilayer structure;
b) a core region in the lateral plane, wherein
    the core region has a first vertical profile of the refractive index;
    a first set of optical modes having a first vertical profile of the optical field are formed in the core region, the first set of optical modes being characterized by a first dispersion relation between mode wavelength and mode effective angle; and
    the first set of optical modes contains a fundamental transverse optical mode and at least one high-order transverse optical mode; and
c) a periphery region in the lateral plane, wherein
    the periphery region is an adjacent region contiguous in the lateral plane to the core region;
    a boundary between the periphery region and the core region is a vertical surface;
    the periphery region further comprises a chemically transformed region;
    the chemically transformed region is bounded by a bottom boundary and a top boundary;
    the chemically transformed region is formed by a process of selective chemical transformation;
    the process of selective chemical transformation changes the chemical profile in the vertical direction;
    the selective chemical transformation in the chemically transformed region results in a change of the refractive index profile in the chemically transformed region such that the periphery region has a second vertical profile of the refractive index distinct from the first vertical profile of the refractive index;
    a second set of optical modes having a second vertical profile of the optical field are formed in the periphery region, the second set of optical modes being characterized by a second dispersion relation between mode wavelength and mode effective angle;

the second set of optical modes forms a continuum spectrum;

at least one second vertical profile of the optical field is distinct from the first vertical profile of the optical field;

at least one high-order transverse optical mode formed in the core region has a wavelength at resonance with the wavelength of at least one mode of the continuum spectrum of optical modes in the periphery region;

the first vertical profile of the optical field and the second vertical profile of the optical field have a non-zero overlap integral;

a lateral leakage occurs from the core region to the periphery region; and the lateral leakage loss of the at least one high-order transverse optical mode formed in the core region is larger than the lateral leakage loss of the fundamental transverse optical mode formed in the core region.

2. The optoelectronic device of claim 1, wherein the sum of the overlap integrals of one optical mode of the first set of optical modes having the first vertical profile of the optical field with all optical modes of the second set of optical modes having the second vertical profile of the optical field exceeds ten percent.

3. The optoelectronic device of claim 2, wherein the sum of the overlap integral of the one optical mode of the first set of optical modes having the first vertical profile with all optical modes of the second set of optical modes having the second vertical profile exceeds twenty percent.

4. The optoelectronic device of claim 2, wherein the overlap integral of one optical mode of the first set of optical modes having the first vertical profile with at least one optical mode of the second set of optical modes having the second vertical profile exceeds ten percent.

5. The optoelectronic device of claim 4, wherein the overlap integral of one optical mode of the first set of optical modes having the first vertical profile with at least one optical mode of the second set of optical modes having the second vertical profile exceeds twenty percent.

6. The optoelectronic device of claim 1, wherein all high-order transverse optical modes of the first set of optical modes having the first vertical profile of the optical field in the core region have larger lateral leakage losses than the fundamental transverse optical mode of the first set of optical modes having the first vertical profile of the optical field in the core region due to the resonant coupling to the continuum spectrum of the second set of optical modes having the second vertical profile of the optical field in the periphery region.

7. The optoelectronic device of claim 1, wherein the core region further comprises an active medium.

8. The optoelectronic device of claim 7, further comprising d) a means of generating non-equilibrium carriers in the active medium.

9. The optoelectronic device of claim 6, wherein the optoelectronic device operates as a single transverse mode optoelectronic device.

10. The optoelectronic device of claim 8, wherein the means of generating of non-equilibrium carriers are selected from the group consisting of: (i) current injection, (ii) photoexcitation, (iii) electron beam excitation.

11. The optoelectronic device of claim 1, wherein the process of selective chemical transformation is carried out by a means selected from the group of means consisting of: i) selective implantation of impurities, ii) selective diffusion of impurities, iii) selective implantation of point defects, iv) selective diffusion of point defects, v) selective laser annealing, and vi) any combination of i) through v).

12. The optoelectronic device of claim 11, wherein the process of selective chemical transformation is selected from the group of processes consisting of: (i) alloy compositional intermixing, (ii) alloy phase separation, and (iii) a combination of (i) and (ii).

13. The optoelectronic device of claim 11, wherein the diffusion of impurities is diffusion of at least one type of n-type impurity.

14. The optoelectronic device of claim 13, wherein the at least one type of n-type impurity is Silicon.

15. The optoelectronic device of claim 1, wherein the multilayer structure further comprises (A) a bottom reflector, (B) a first cavity adjacent to said bottom reflector, (C) a top reflector adjacent to said cavity on the side opposite to said bottom reflector.

16. The optoelectronic device of claim 15, wherein the bottom reflector and the top reflector are selected from the group consisting of (A) a multilayer interference reflector, and (B) an evanescent reflector.

17. The optoelectronic device of claim 7, further comprising a first p-n junction, wherein the active medium is located within the first p-n junction.

18. The optoelectronic device of claim 17, further comprising a second p-n junction, wherein the second p-n junction is located in the periphery region at the bottom boundary of the chemically transformed region.

19. The optoelectronic device of claim 18, wherein the opening voltage of the second p-n junction exceeds the opening voltage of the first p-n junction by at least zero point one Volt (0.1 V).

20. The optoelectronic device of claim 7, wherein the active medium is selected from a group consisting of: i) bulk material; ii) single or multiple quantum well; iii) single or multiple sheet of quantum wires; iv) single of multiple sheet of quantum dots; v) any combination of i) through iv).

21. The optoelectronic device of claim 1, wherein the materials used for fabrication of the optoelectronic device are selected from the group consisting of: (i) III-V materials; (ii) III-N materials; (iii) II-VI materials; (iv) group IV materials; and (v) any combination of (i) through (iv).

22. The optoelectronic device of claim 8, wherein the optoelectronic device is selected from the group consisting of: (i) light-emitting diode; (ii) edge-emitting laser diode; (iii) surface-emitting laser diode; (iv) tilted wave laser diode; (v) tilted cavity laser diode; (vi) semiconductor disc laser; (vii) passive cavity surface-emitting laser; (viii) single photon emitter; (ix) emitter of entangled photons; (x) semiconductor gain chip.

23. The optoelectronic device of claim 15 grown epitaxially on a substrate.

24. An array of optoelectronic devices comprising at least two optoelectronic devices according to claim 1.

25. The array of optoelectronic devices of claim 24, wherein the optical fields of the at least two optoelectronic devices of the array of optoelectronic devices are coherently optically coupled with each other.

26. The array of optoelectronic devices of claim 24, wherein the array is employed for the steering of a laser beam.

27. The array of optoelectronic devices of claim 24, wherein all optoelectronic devices forming the array are positioned on a single wafer.

28. The array of optoelectronic devices of claim 24, wherein the at least two optoelectronic devices forming the array are positioned on two different wafers.

29. The array of optoelectronic devices of claim 24, wherein the array of optoelectronic devices is further positioned in an external cavity.

30. The array of optoelectronic devices of claim 24, wherein the array of optoelectronic devices is a source of the primary light for a frequency conversion system.

* * * * *